US012575372B2

(12) United States Patent
Takata

(10) Patent No.: US 12,575,372 B2
(45) Date of Patent: Mar. 10, 2026

(54) SEMICONDUCTOR WAFER AND METHOD FOR MANUFACTURING SEMICONDUCTOR WAFER

(71) Applicant: Mitsubishi Electric Corporation, Tokyo (JP)

(72) Inventor: Masao Takata, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 742 days.

(21) Appl. No.: 17/929,399

(22) Filed: Sep. 2, 2022

(65) Prior Publication Data

US 2023/0163015 A1 May 25, 2023

(30) Foreign Application Priority Data

Nov. 19, 2021 (JP) ................................. 2021-188553

(51) Int. Cl.
| | |
|---|---|
| *H01L 21/683* | (2006.01) |
| *H01L 21/66* | (2006.01) |
| *H01L 21/67* | (2006.01) |
| *H01L 23/544* | (2006.01) |

(52) U.S. Cl.
CPC .... *H01L 21/6836* (2013.01); *H01L 21/67092* (2013.01); *H01L 22/34* (2013.01); *H01L 23/544* (2013.01); *H01L 2221/68327* (2013.01); *H01L 2223/54426* (2013.01)

(58) Field of Classification Search
CPC ........... H01L 21/6836; H01L 21/67092; H01L 22/34; H01L 23/544
See application file for complete search history.

(56) References Cited

U.S. PATENT DOCUMENTS

| | | | |
|---|---|---|---|
| 2002/0038912 A1 | 4/2002 | Miyagawa | |
| 2002/0043700 A1 | 4/2002 | Sasaki et al. | |
| 2009/0162993 A1* | 6/2009 | Yui ........................ | B28D 5/022 |
| | | | 257/E21.599 |
| 2010/0181681 A1* | 7/2010 | Akiba ..................... | H01L 21/78 |
| | | | 257/773 |

(Continued)

FOREIGN PATENT DOCUMENTS

| | | |
|---|---|---|
| JP | S61-231713 A | 10/1986 |
| JP | S62-112348 A | 5/1987 |

(Continued)

OTHER PUBLICATIONS

"Notice of Reasons for Refusal" Office Action issued in JP 2021-188553; mailed by the Japanese Patent Office on Sep. 10, 2024.

(Continued)

*Primary Examiner* — Jeff W Natalini
*Assistant Examiner* — Rose Keagy
(74) *Attorney, Agent, or Firm* — Studebaker Brackett PLLC

(57) ABSTRACT

A semiconductor wafer is diced along a plurality of dicing lines in a first direction and a second direction different from the first direction so that a chip is cut out from an effective area. The semiconductor water includes a film formation pattern. At least one dicing line included in the plurality of dicing lines is an on-pattern dicing line which overlaps the film formation pattern in its entire or partial length.

17 Claims, 36 Drawing Sheets

(56)          References Cited

U.S. PATENT DOCUMENTS

| 2013/0203238 | A1 | 8/2013 | Tamenori |
| 2017/0221782 | A1 | 8/2017 | Eguchi et al. |
| 2018/0269162 | A1* | 9/2018 | Takahashi ............. H01L 23/544 |

FOREIGN PATENT DOCUMENTS

| JP | H03-129855 A | 6/1991 |
| JP | H11-074229 A | 3/1999 |
| JP | 2002-23344 A | 1/2002 |
| JP | 2006-148007 A | 6/2006 |
| JP | 2011-129551 A | 6/2011 |
| JP | 2016-105463 A | 6/2016 |
| WO | 2012/039403 A1 | 3/2012 |

OTHER PUBLICATIONS

"Office Action" issued in DE 10 2022 127 670.8 by the German Patent and Trade Mark Office on Nov. 20, 2025.

* cited by examiner

F I G. 3
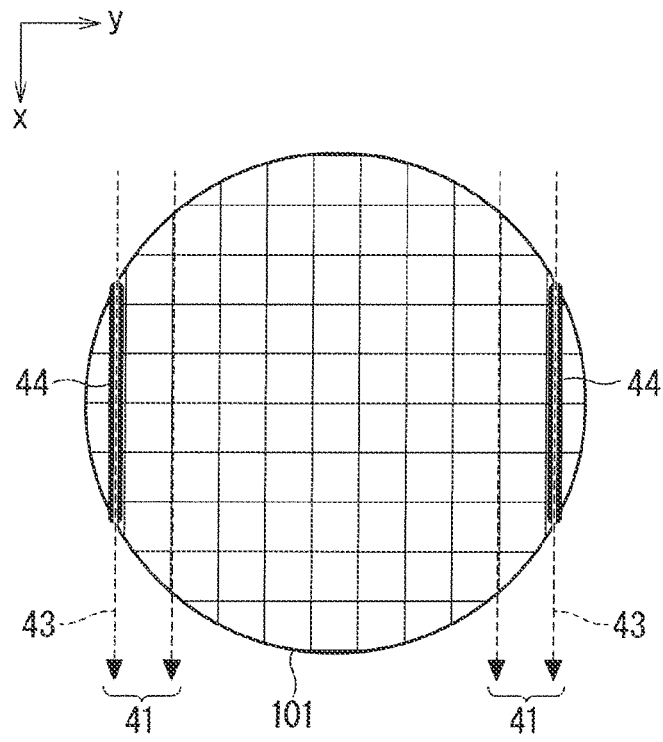
F I G. 4
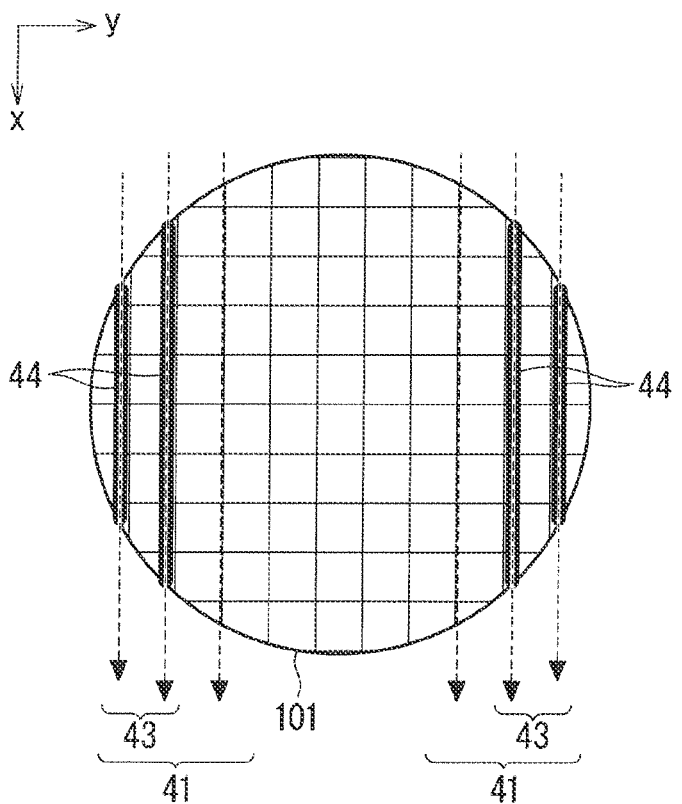

OR

=

=

=

‖

OR

‖

| CROSS-SECTIONAL FORM / PLANAR FORM | ISLAND SHAPE | DL FULLY COVERED | CHIP TERMINAL PORTION COVERED | ENTIRE CHIP COVERED |
|---|---|---|---|---|
| ENTIRE SURFACE COVERED | ◯ | ◯ | ◯ | ◯ |
| DIVIDED AT EQUAL INTERVALS | ◯ | ◯ | — | — |
| FINELY DIVIDED | ◯ | ◯ | — | — |

SEMICONDUCTOR WAFER AND METHOD FOR MANUFACTURING SEMICONDUCTOR WAFER

BACKGROUND OF THE INVENTION

Field of the Invention

The present disclosure relates to a semiconductor wafer and a method for manufacturing the semiconductor wafer.

Description of the Background Art

In a dicing process, a wafer is fixed to a chuck table (CT) by a UV tape and cut into a chip shape by a blade. If the wafer is warped or distorted, the stress inherent in the wafer is released at the time of dicing, thereby causing chipping or a crack in the chip.

Note that chipping or a crack during dicing is also pointed out in Japanese Patent Application Laid-Open No. 2016-105463.

In the conventional technique, since it is inevitable to press or fix a warped or distorted wafer on a flat surface of a chuck table, stress existing in the wafer is released within an effective area at the time of dicing. As a result, there is a problem that chipping or a crack occurs in a side surface or the lower surface of the device, resulting in a potential defect.

In addition, in a case where a wafer is diced with a blade, the impact on the wafer is large. Therefore, due to variations in conditions such as the amount of warpage or distortion of the wafer, the sticking holding force of the UV tape on the chuck table, or the grinding performance of the blade, dicing often proceeds in an unstable state, and there is a concern that chipping or a crack of a device is promoted and frequently occurs.

SUMMARY

An object of the present disclosure is to suppress chipping or a crack during dicing of a wafer.

The semiconductor wafer of the present disclosure is a semiconductor wafer which is diced along a plurality of dicing lines in a first direction and a second direction different from the first direction so that a chip is cut out from an effective area. The semiconductor wafer includes a film formation pattern. At least one dicing line included in the plurality of dicing lines is an on-pattern dicing line which overlaps the film formation pattern in its entire or partial length.

According to the semiconductor wafer of the present disclosure, at least part of the dicing line overlaps the film formation pattern. Therefore, chipping or a crack can be suppressed during dicing of the semiconductor wafer.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 1 to 12 are plan views of semiconductor wafers each illustrating an arrangement example of on-pattern DLs and on-pattern DL portions;

DESCRIPTION OF THE PREFERRED EMBODIMENTS

A. First Preferred Embodiment

Figure 1:
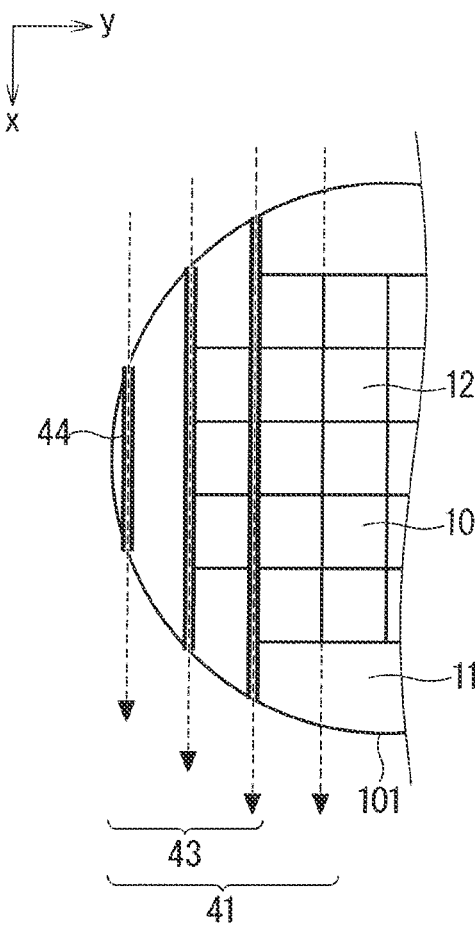

FIG. 1 is a plan view of a semiconductor wafer 101 according to a first preferred embodiment. In FIG. 1, an up-down direction of a paper surface is an x-axis, and a right-left direction of the paper surface is a y-axis. The directions of these axes are similar in other plan views described later.

The semiconductor wafer 101 is cut in the x direction and the y direction along a plurality of dicing lines (hereinafter also referred to as DLs). In FIG. 1, DLs 41 in the x direction are indicated by broken line arrows, and illustration of DLs in the y direction is omitted. Note that, although the DLs are actually in an area on the semiconductor wafer 101, broken line arrows representing the DLs 41 and the like are extended outside the semiconductor wafer 101 in order to clearly illustrate the directions of the DLs in FIG. 1 and the following drawings.

The semiconductor wafer 101 includes an effective area 10 in which a chip 12 cut out by dicing exists and an ineffective area 11 other than the effective area 10.

A film formation pattern is formed in the semiconductor wafer 101 of the first preferred embodiment. At least one of the plurality of DLs for cutting the semiconductor wafer 101 is an on-pattern DL 43 overlapping the film formation pattern in its entire or partial length. A portion of the on-pattern DL 43 overlapping the film formation pattern is referred to as an on-pattern DL portion 44.

In the example of FIG. 1, three of the plurality of DLs 41 in the x direction are on-pattern DLs 43, and entirety of the on-pattern DLs 43 are on-pattern DL portions 44.

Hereinafter, layouts of the on-pattern DLs 43 and the inn-pattern DL portions 44 in the semiconductor wafer 101 will be described.

<A-1-1. Arrangement of On-Pattern DL Portion 44>

The arrangement of the on-pattern DL portions 44 is assumed as follows.

(1) As illustrated in FIG. 1, the on-pattern DL portions 44 may be arranged in the effective area 10 and the ineffective area 11 in the DLs 41 in the x direction.

Figure 2:
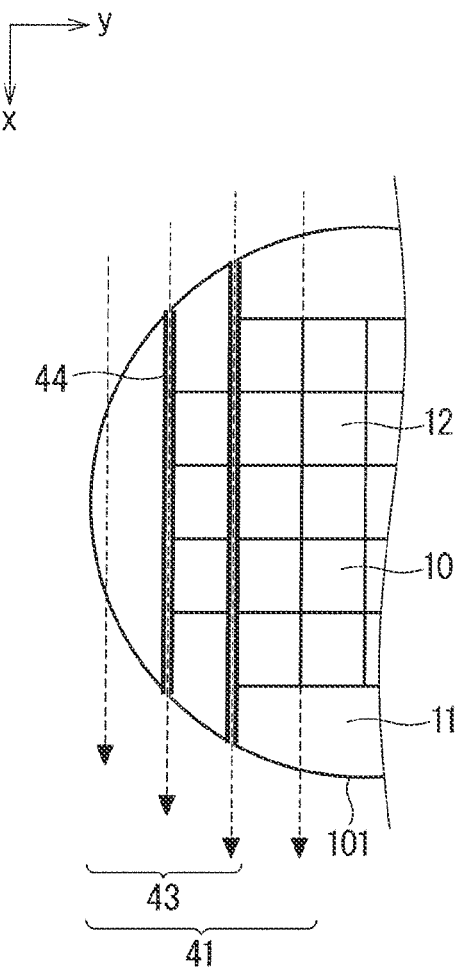

(2) As illustrated in FIG. 2, the on-pattern DL portions 44 may be arranged only in the chips 12 in the outermost periphery of the effective area 10 of the semiconductor wafer 101.

<A-1-2. Number of On-Pattern DLs 43>

The number of on-pattern DLs 43 is assumed to be as follows.

(1) The on-pattern DL 43 may be the first DL or the first and second DLs in the x direction. Here, the first DL refers to a DL cut first into the semiconductor wafer 101 in a dicing process, and the second DL refers to a DL cut second into the semiconductor wafer 101 in the dicing process. Hereinafter, the number of DLs is counted in order of cutting into the semiconductor wafer 101 in the dicing process.

FIG. 3 illustrates a state in which the first DL 41 in the x direction is the on-pattern DL 43. FIG. 4 illustrates a state in which the first and second DLs 41 in the x direction are the on-pattern DLs 43.

Figure 5:
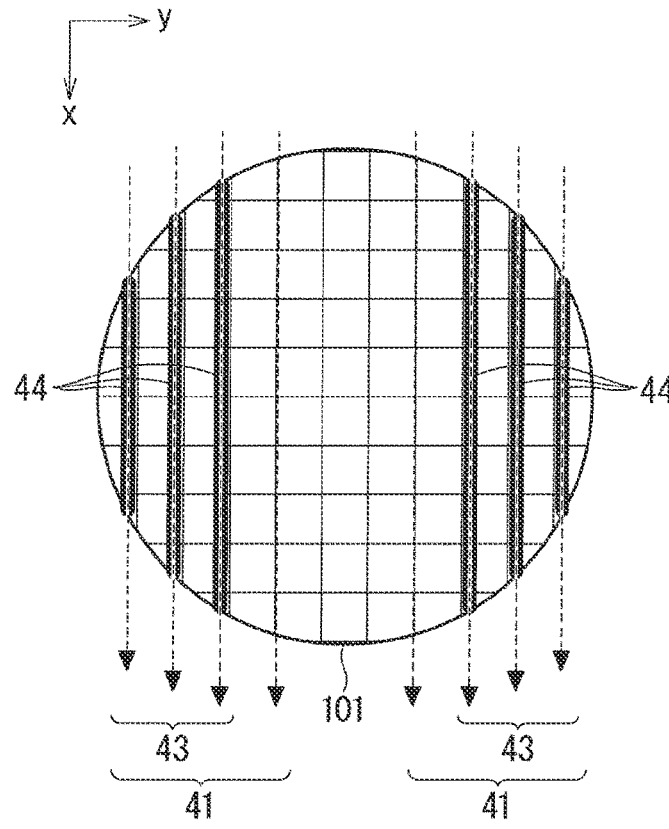
Figure 6:
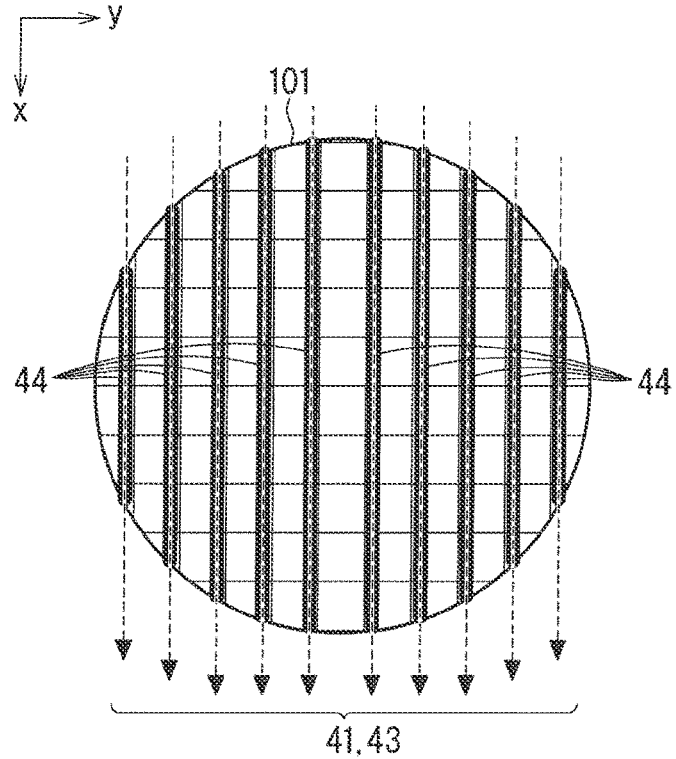

(2) The on-pattern DLs 43 may be the first to third DLs, the first to fourth DLs, or the first to fifth DLs 41 in the x direction. FIG. 5 illustrates a state in which the first to third DLs 41 in the x direction are the on-pattern DLs 43. FIG. 6 illustrates a state in which the first to fifth DLs 41 in the x direction are the on-pattern DLs 43.

Figure 7:
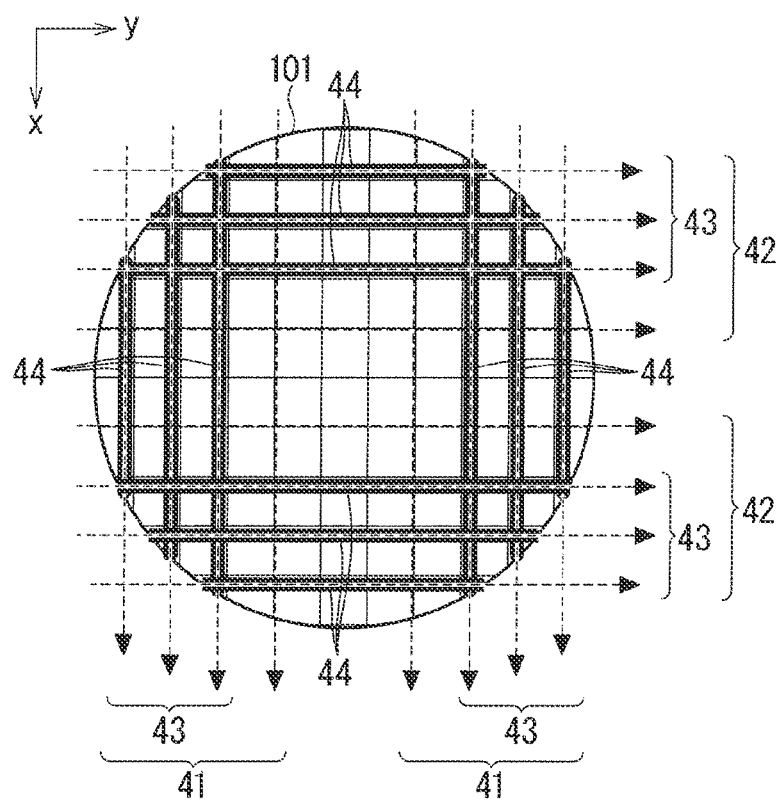

(3) The on-pattern DLs 43 may be the first to third, first to fourth, or first to fifth DLs 41 in the x direction, and first to third, first to fourth, or first to fifth DLs 42 in the y direction. FIG. 7 illustrates a state in which the first to third DLs 41 in the x direction and the first to third DLs 42 in the y direction are the on-pattern DLs 43. In FIG. 7, the DLs 42 in the y direction are indicated by broken line arrows.

<A-1-3. Length of On-Pattern DL Portion>

The length of the on-pattern DL portion 44 is assumed as follows.

The on-pattern DL portion 44 is part or entirety of the on-pattern DL 43. That is, the length of the on-pattern DL portion 44 is part or entirety of the entire length of the on-pattern DL 43.

Figure 8:
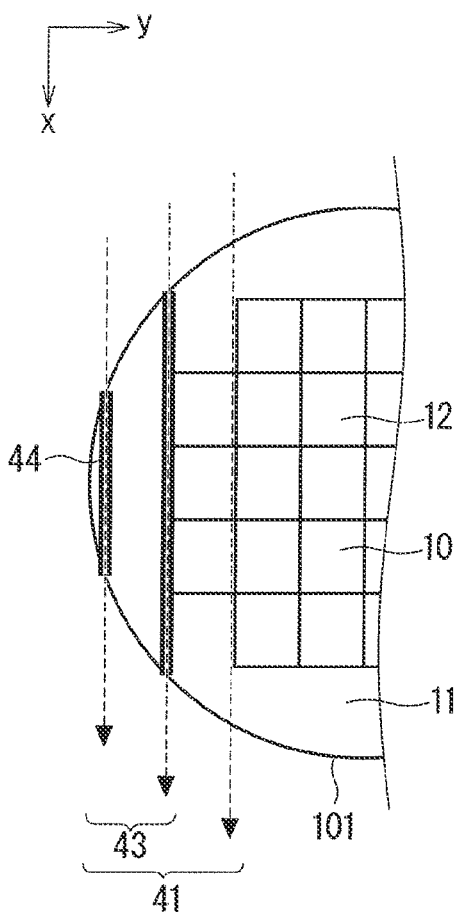

FIG. 8 illustrates a state in which entirety of the two on-pattern DLs 43 in the x direction are the on-pattern DL portions 44. That is, in FIG. 8, the length of the on-pattern DL portion 44 is the entire length of the on-pattern DL 43 in the x direction.

Figure 9:
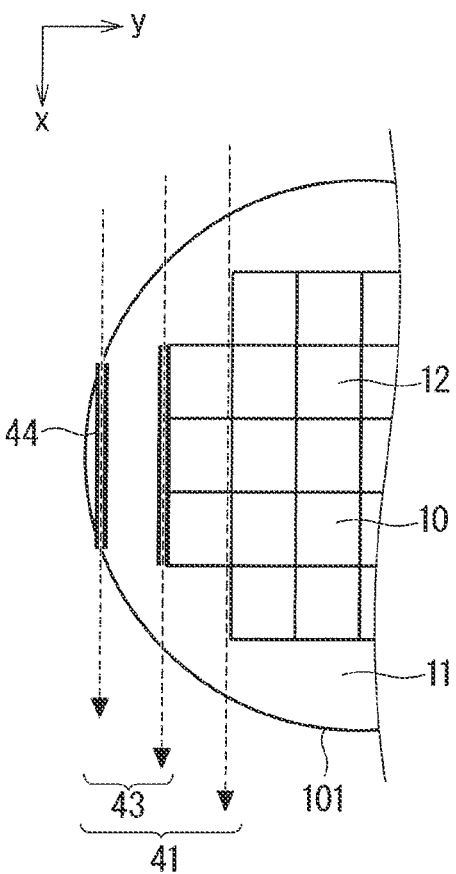

FIG. 9 illustrates a state in which entirety of the first on-pattern DL 43 in the x direction and part of the second on-pattern DL 43 in the x direction are the on-pattern DL portions 44. In the second on-pattern DL 43, only the portion having the same length as that of the first on-pattern DL 43 is the on-pattern DL portion 44. That is, in FIG. 9, the length of the on-pattern DL portion 44 is part or entirety of the entire length of the on-pattern DL 43 in the x direction.

Figure 10:
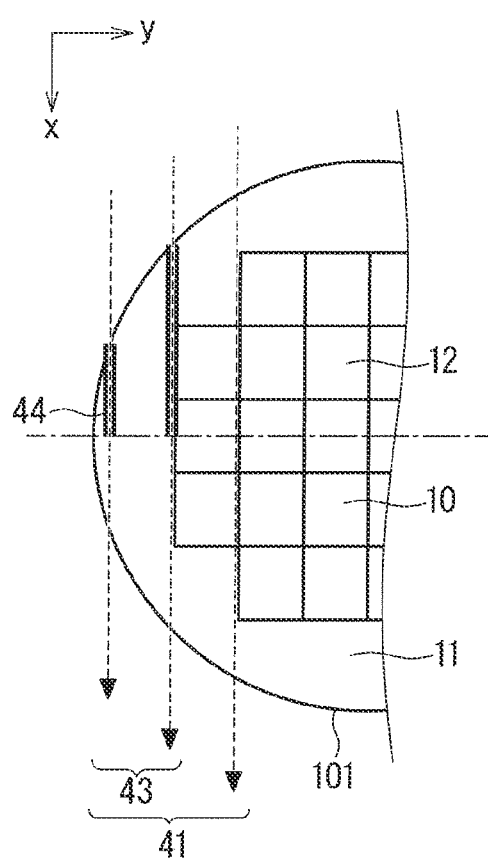

FIG. 10 illustrates a state in which ½ of the entire length of each on-pattern DL 43 of the two on-pattern DLs 43 in the x direction is the on-pattern DL portion 44. That is, in FIG. 10, the length of the on-pattern DL portions 44 is ½ of the entire length of the two on-pattern DLs 43 in the x direction.

In the examples of FIGS. 8 to 10, the on-pattern DL portion 44 is arranged regardless of the effective area 10 and the ineffective area 11. In contrast, in the following examples, the on-pattern DL portion 44 is arranged only in the ineffective area 11.

Figure 11:
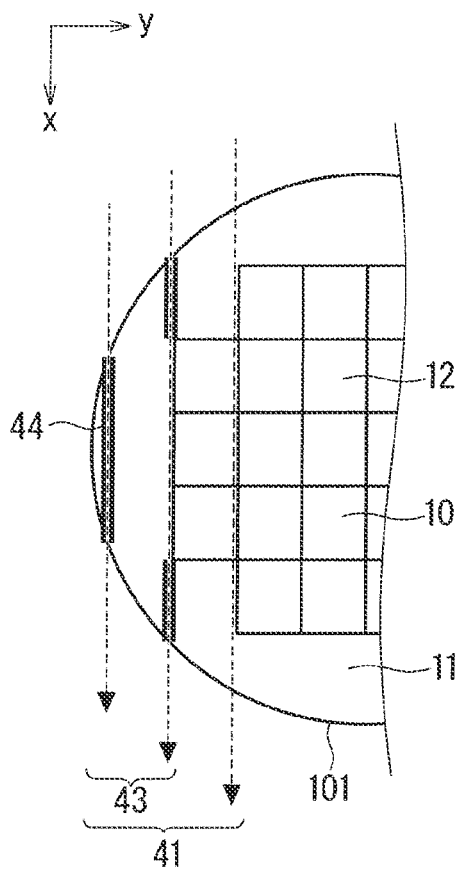

In the example of FIG. 11, a state is illustrated in which only portions of the two on-pattern DLs 43 in the x direction in the ineffective area 11 are the on-pattern DL portions 44. That is, in FIG. 11, the length of the on-pattern DL portions 44 is the length of the portions of the two on-pattern DLs 43 in the x direction arranged in the ineffective area 11.

Figure 12:
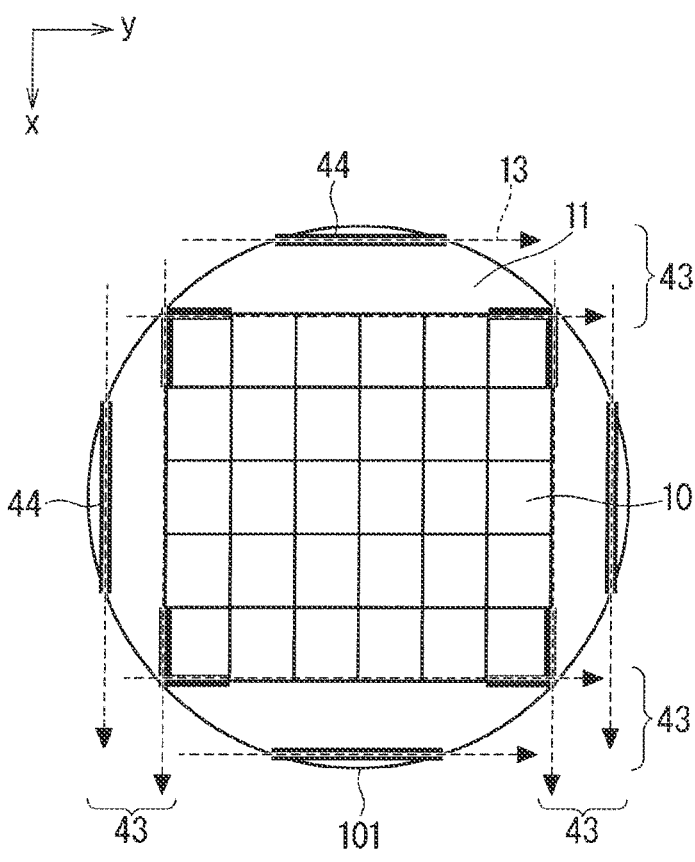

In the example of FIG. 12, a state is illustrated in which only portions of the two on-pattern DLs 43 in the x direction and the two on-pattern DLs 43 in the y direction in the ineffective area 11 are the on-pattern DL portions 44. That is, in FIG. 12, the length of the on-pattern DL portions 44 is the length of the portions of the two on-pattern Ins 43 in the x direction and the two on-pattern DLs 43 in the y direction arranged in the ineffective area 11.

<A-2. Effect>

The semiconductor wafer 101 according to the first preferred embodiment is diced along the plurality of dicing lines 41, 42 in the x direction and the y direction so that the chip 12 is cut out from the effective area 10. The semiconductor wafer 101 includes the film formation pattern 3. At least one dicing line included in the plurality of dicing lines 41, 42 is the on-pattern dicing line 43 which overlaps the film formation pattern 3 in its entire or partial length. As a result, it is possible to reduce chipping or cracks during dicing due to inherent stress of warpage or distortion of the semiconductor wafer 101.

By forming the film formation pattern 3 on the on-pattern DL 43, the following effects are obtained.

(A) The amount of chipping or cracks spreading from the side surface to the lower surface of the semiconductor wafer 101 can be reduced.

(B) Conventionally, the size of chipping or a crack in the lower surface of the semiconductor wafer 101 is about half of the size of chipping or a crack in the side surface of the semiconductor wafer 101; however, this size can be further reduced.

(C) The chipping amount in the upper surface of the semiconductor wafer 101 can be reduced.

In addition, the warpage stress inherent in the semiconductor wafer 101 may be released only once at one of warped or distorted portions (unduly the outer periphery of the wafer) in the semiconductor wafer 101. The portion where the warpage stress inherent in the semiconductor wafer 101 is released can be designated by the number and direction of the on-pattern DL 43 and the length of the on-pattern DL portion 44.

That is, in the ineffective area 11 or the effective area 10 on the outer periphery of the semiconductor wafer 101, by providing a film formation pattern in the vicinity of a defective product in electrical characteristics or appearance inspection even for several DLs 41, 42 cut into the semiconductor wafer 101 first, the amount of chipping or cracks can be reduced without affecting the chips 12 as products.

When the semiconductor wafer 101 is diced using two dicing blades, the amount of chipping (cracks) can be reduced by providing a film formation pattern on either one of the DLs 41, 42 in the semiconductor wafer 101.

In the DL first cut into the semiconductor wafer 101, if ½ or more of the DL length is cut, the size of chipping (crack) greatly decreases thereafter. Therefore, in the outermost DLs 41, 42 of the semiconductor wafer 101, if about ½ to ⅔ of the entire length of the DL is set as the on-pattern DL portion 44, chipping (cracks) can be halved.

The length of chipping (crack) corresponding to the amount of warpage of the semiconductor wafer 101 is roughly known. If the maximum of five DLs are set as the on-pattern DL portions 44, the chipping crack) amount can be reduced.

According to the semiconductor wafer 101 of the first preferred embodiment, a high yield after dicing can be obtained by arranging the on-pattern DL portion 44 in the ineffective area 11 or an area where a defective product is located in the effective area 10.

B. Second Preferred Embodiment

<B-1. Photomask>

In a second preferred embodiment, a manufacturing process of the semiconductor wafer 101 according to the first preferred embodiment will be described. In a front-end process of semiconductor manufacturing, a film formation pattern is formed on the on-pattern DL 43 of the semiconductor wafer 101. Hereinafter, a state of the semiconductor wafer 101 before the pattern of the chips 12 or the film formation pattern is formed is referred to as a base wafer BW. Hereinafter, a photomask used in a photolithography process for forming a film formation pattern on the base wafer BW will be described.

Figure 13:
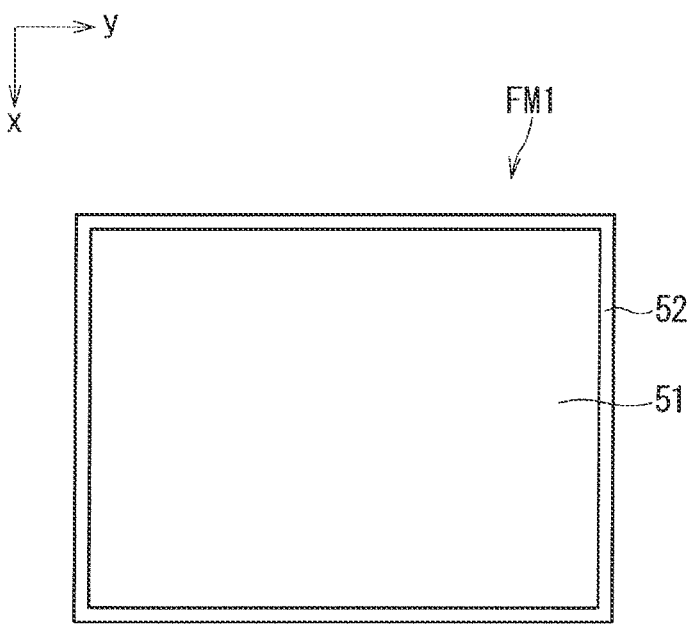
FIG. 13 is a plan view illustrating a unit pattern of a first photomask.
Figure 14:
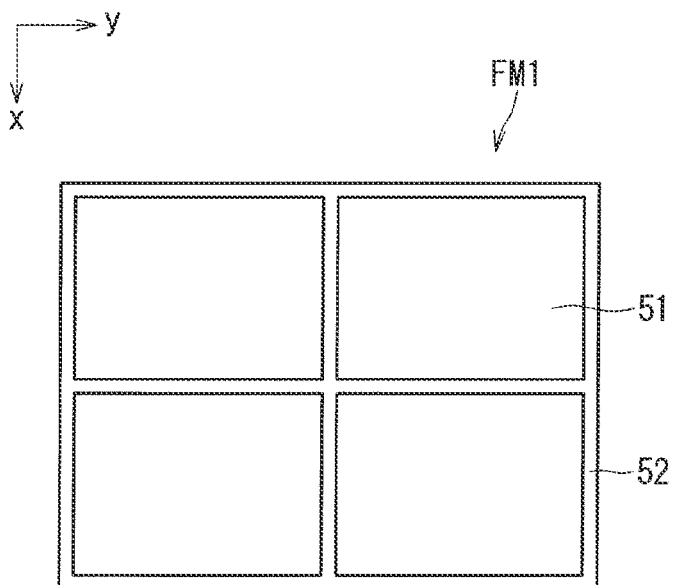
FIG. 14 is a plan view illustrating the first photomask in which unit patterns are arranged in two rows and two columns.

FIG. 13 illustrates a unit pattern of a first photomask FM1. FIG. 14 illustrates the first photomask FM1 in which unit patterns are combined in two rows and two columns. The first photomask FM1 includes a chip pattern area 51 for drawing a pattern of the chip 12 on the semiconductor wafer 101 and a DL pattern area 52 for forming the DLs 41, 42 on the semiconductor wafer 101. The DL pattern area 52 extends in the x direction and the y direction. A portion extending in the x direction of the DL pattern area 52 is also referred to as a first portion, and a portion extending in the y direction is also referred to as a second portion. In the first photomask FM1 there is no pattern 53 for a film formation pattern for drawing a film formation pattern on the semiconductor wafer 101 in the DL pattern area 52.

Figure 15:
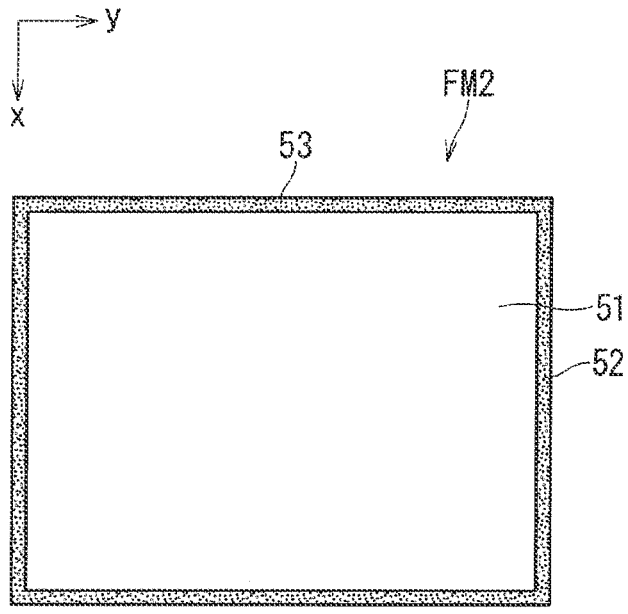
FIG. 15 is a plan view illustrating a unit pattern of a second photomask.
Figure 16:
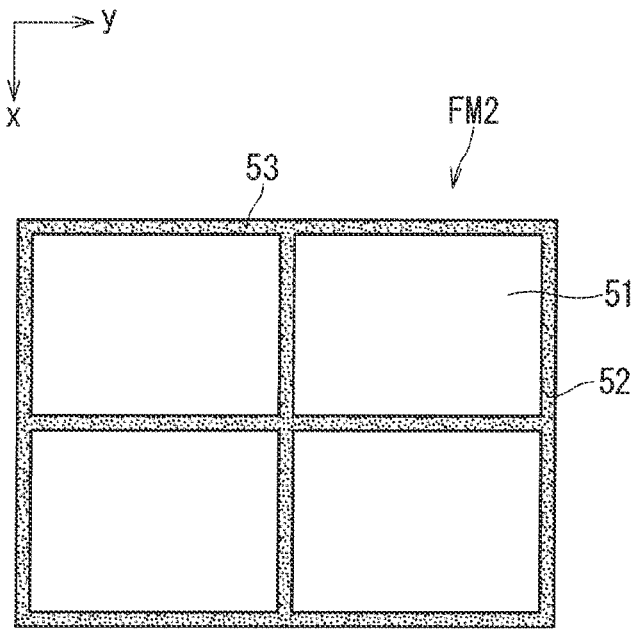
FIG. 16 is a plan view illustrating the second photomask in which unit patterns are arranged in two rows and two columns.

FIG. 15 illustrates a unit pattern of a second photomask FM2. FIG. 16 illustrates the second photomask FM2 in which unit patterns are combined in two rows and two columns. The second photomask FM2 is obtained by providing the pattern 53 for a film formation pattern in each of all the DL pattern areas 52 in the first photomask FM1.

Figure 17:
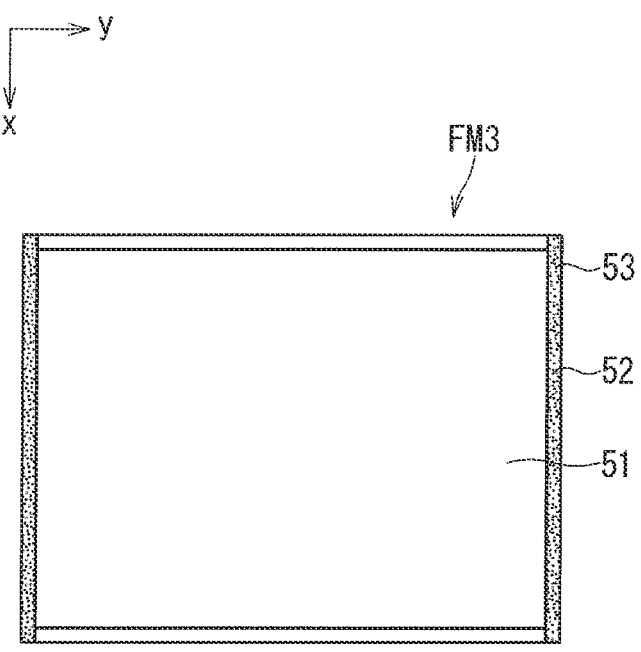
FIG. 17 is a plan view illustrating a unit pattern of a third photomask.
Figure 18:
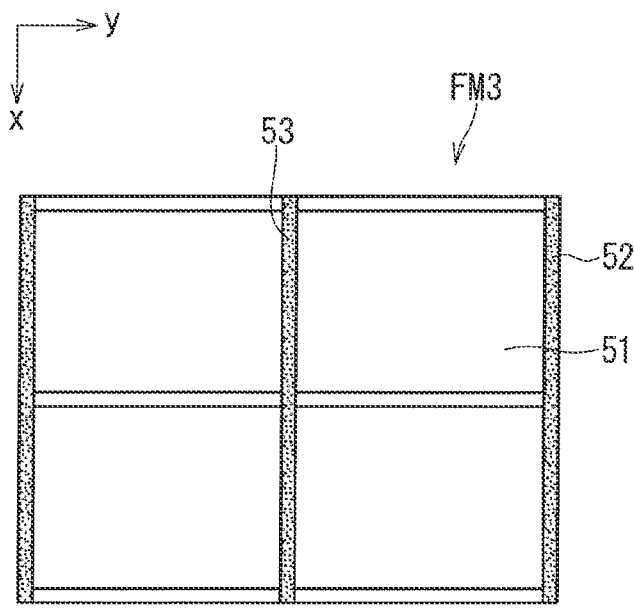
FIG. 18 is a plan view illustrating the third photomask in which unit patterns are arranged in two rows and two columns.

FIG. 17 illustrates a unit pattern of a third photomask FM3. FIG. 18 illustrates the third photomask FM3 in which unit patterns are combined in two rows and two columns. The third photomask FM3 is obtained by providing the pattern 53 for a film formation pattern in either the DL pattern areas 52 extending in the x direction or the DL pattern areas 52 extending in the y direction in the first photomask FM1.

<B-2. Photolithography Process>

In the photolithography process, the first to third photomasks FM1 to FM3 are used in combination according to the magnitude of warpage or distortion of the base wafer BW.

Figure 19:
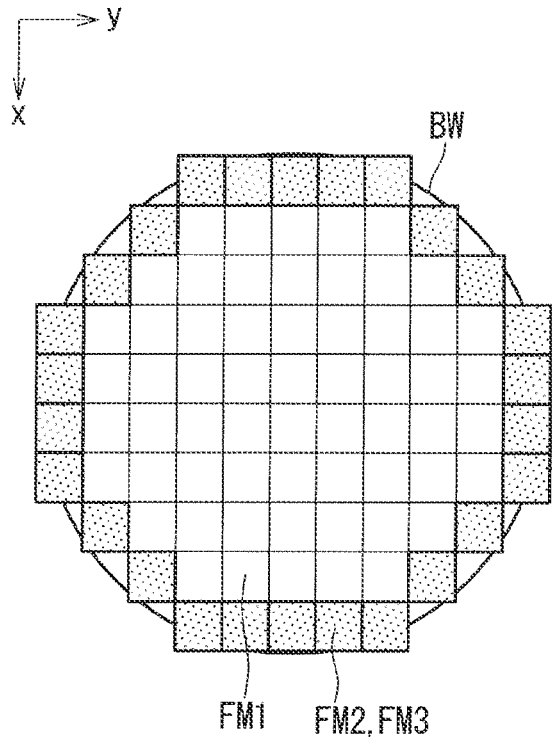
FIG. 19 is a view illustrating an arrangement of the photomasks with respect to a base wafer having a small warpage.

In a case where warpage or distortion of the base wafer BW is small, the second photomask FM2 or the third photomask FM3 is drawn in one column from the outer periphery of the base wafer BW as illustrated in FIG. 19. Then, the first photomask FM1 is drawn in the remaining central portion. As a result, a film formation pattern is formed on the outer peripheral portion of the base wafer BW, and a film formation pattern is not formed on the central portion.

Figure 20:
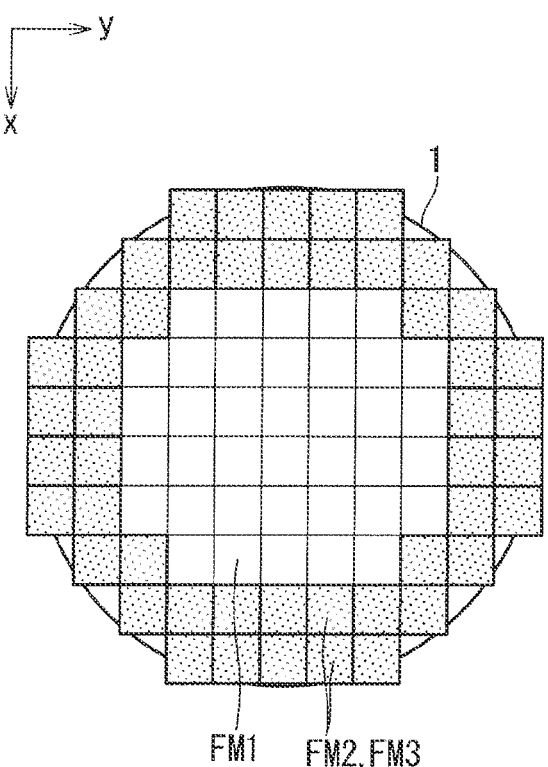
FIG. 20 is a view illustrating an arrangement of the photomasks with respect to a base wafer having a large warpage.

In a case where warpage or distortion of the base wafer BW is large, the range in which the second photomask FM2 or the third photomask FM3 is drawn is increased according to the degree of warpage or distortion. In the example of FIG. 20, two columns, from the outer periphery of the base wafer BW are set as the outer peripheral portion, the second photomask FM2 or the third photomask FM3 is drawn in the outer peripheral portion, and the first photomask FM1 is drawn in the remaining central portion. That is, as warpage of the base wafer BW increases, the width of the outer peripheral portion of the base wafer BW in which the second photomask FM2 or the third photomask FM3 is drawn increases.

<B-3. Effect>

The method for manufacturing the semiconductor wafer according to the second preferred embodiment includes: (a) a step of drawing the first photomask FM1 on the central portion of a semiconductor substrate 17; and (b) a step of drawing the second photomask FM2 or the third photomask FM3 on the outer peripheral portion surrounding the central portion of the semiconductor substrate 17. Each of the first, second, and third photomasks FM2, and FM3 includes the chip pattern area 51 in which a chip pattern is formed, and the DL pattern area 52 in which a pattern of the plurality of dicing lines 41, 42 is formed. The DL pattern area 52 surrounds the chip pattern area 51 and has the first portion extending in the first direction and the second portion extending in the second direction. In the DL pattern area 52 of the second photomask FM2, the pattern 53 for a film formation pattern for drawing a film formation pattern in the first portion and the second portion is formed. In the DL pattern area 52 of the third photomask FM3, the pattern 53 for a film formation pattern is formed in one of the first portion and the second portion. The greater the warpage of the semiconductor substrate 17, the greater the width of the outer peripheral portion.

Therefore, according to the method for manufacturing a semiconductor wafer of the second preferred embodiment, by selectively using the first to third photomasks FM1 to FM3 according to the location in the semiconductor wafer 101, it is possible to designate the portion where the film formation pattern 3 is formed in the semiconductor wafer 101. Therefore, it is possible to freely form a film formation pattern in a warped or distorted portion on the semiconductor wafer 101. In addition, by minimizing the number of film formation patterns, clogging of the dicing blade due to the film formation patterns can be minimized.

C. Third Preferred Embodiment

In a third preferred embodiment, a detailed configuration of the film formation pattern in the semiconductor wafer 101 according to the first preferred embodiment will be described.

<C-1. Configuration>

Figure 21:
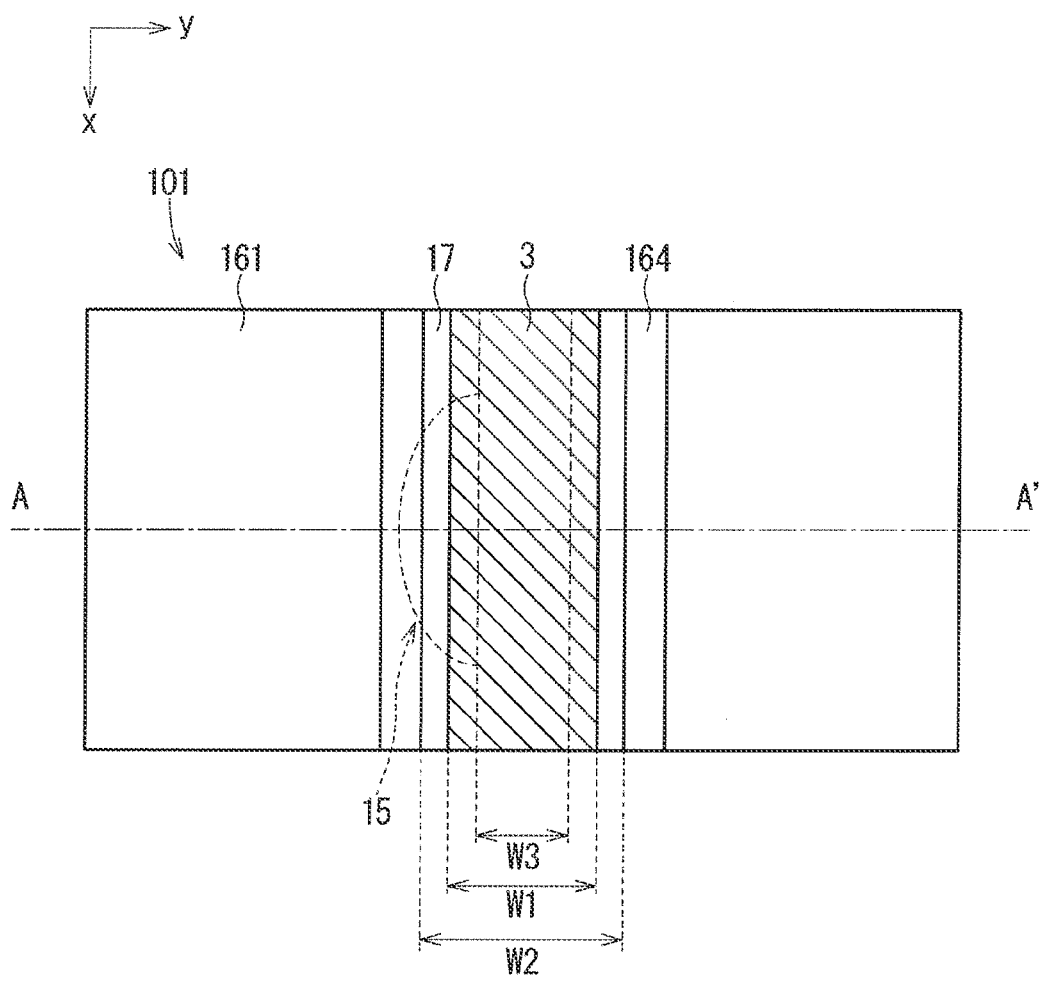
FIG. 21 is a plan view of the semiconductor wafer in which a film formation pattern is formed.
Figure 22:
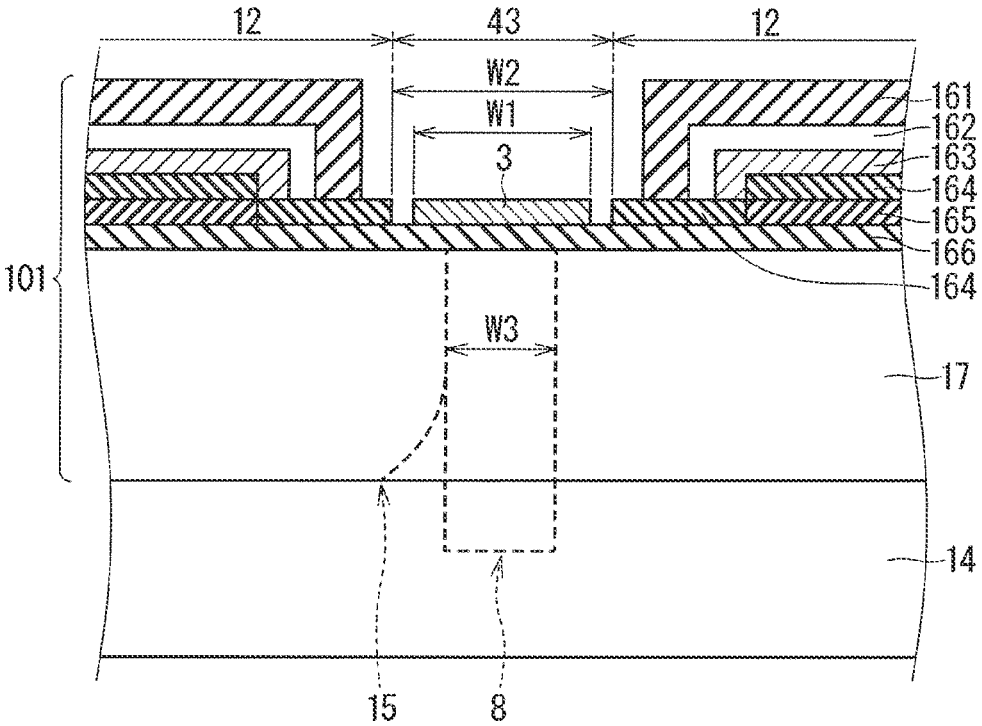
FIG. 22 is a cross-sectional view of the semiconductor wafer in which the film formation pattern is formed.

FIG. 21 is a plan view of the semiconductor wafer 101 in which the film formation pattern 3 is formed. FIG. 22 is a cross-sectional view of the semiconductor wafer 101 taken along line A-A' of FIG. 21. In FIG. 21, the film formation pattern 3 is continuously formed along the on-pattern DL 43 in the x direction, but may be intermittently formed. Note that the semiconductor wafer 101 may have the film formation pattern 3 in the y direction; however, since the film formation patterns 3 in the x direction and the y direction have the same configuration, only the film formation pattern 3 in the x direction will be described below.

A width W1 of the film formation pattern 3 is smaller than a width W2 of the on-pattern DL 43 and greater than a width W3 of the dicing blade.

The film property of the film formation pattern 3 is a type that can be manufactured in a wafer front-end process, and constitutes the chip 12, which is a product. The film formation pattern 3 includes a single layer or a plurality of layers.

When the semiconductor wafer 101 is diced, the semiconductor wafer 101 is fixed on a UV tape 14 as illustrated in FIG. 22. The semiconductor wafer 101 includes the semiconductor substrate 17 and various layers formed on the semiconductor substrate 17 in the wafer front-end process. The semiconductor substrate 17 is also referred to as the base wafer BW. The semiconductor substrate 17 is made of Si, SiC, or GaN. Note that in FIG. 22, reference numeral 15 denotes a crack spreading from the side surface to the back surface of the chip 12.

Another film 166, a field film 165, an interlayer film 164, an electrode 163, a glass coating 162, and a polyimide film 161 are formed on the semiconductor substrate 17 in the wafer front-end process. The glass coating 162 is made of an oxide film, a nitride film, or the like. The electrode 163 is made of Al, AlSi, Poly-Si, or the like. The field film 165 and the other film 166 are oxide films.

Therefore, the film formation pattern 3 can have any one of the following configurations (1) to (9).

Figure 23:
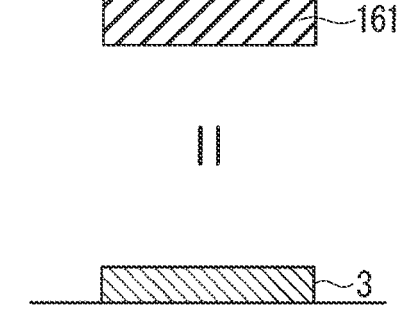
FIGS. 23 to 29 are views each illustrating a configuration of the film formation pattern.
Figure 24:
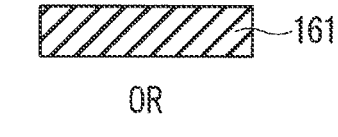
Figure 25:
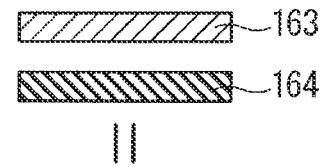
Figure 25:
Figure 26:
Figure 26:
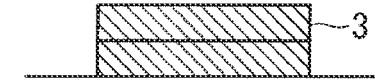
Figure 27:
Figure 27:
Figure 28:
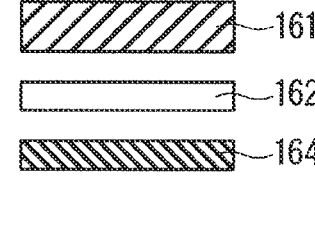
Figure 28:
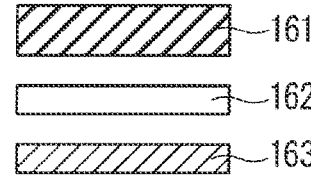
Figure 28:
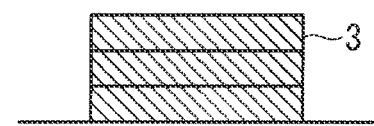
Figure 29:
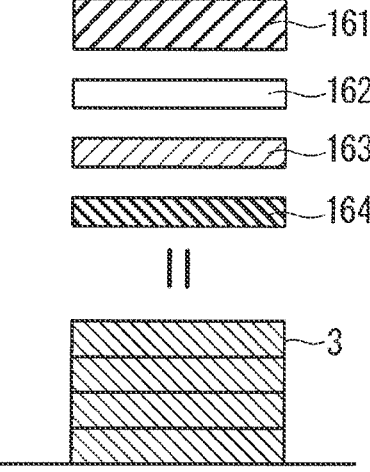

(1) Lamination of a polyimide film, a glass coating, an electrode, and an interlayer film (2) Lamination of a polyimide film, a glass coating, and an electrode (3) Lamination of a polyimide film and a glass coating (4) Lamination of a glass coating and an electrode (5) Lamination of an electrode and an interlayer film (6) Only an electrode (7) Only an interlayer film (8) Lamination of a polyimide film, a glass coating, and an interlayer film (9) Only a polyimide film FIGS. 23 to 29 illustrate the thickness of the film formation pattern 3 in the configurations (1) to (9). The film formation pattern 3 is a film constituting a product (device) with a thickness that can be manufactured by processing of the wafer front-end process. FIG. 23 illustrates a case where the film formation pattern 3 has a single layer of the polyimide film 161. FIG. 24 illustrates a case where the film formation pattern 3 has a single layer of the polyimide film 161 or the electrode 163. FIG. 25 illustrates a case where the film formation pattern 3 has two layers including the electrode 163 and the interlayer film 164. FIG. 26 illustrates a case where the film formation pattern 3 has two layers including the glass coating 162 and the electrode 163. FIG. 27 illustrates a case where the film formation pattern 3 has two layers including the polyimide film 161 and the glass coating 162. FIG. 28 illustrates a case where the film formation pattern 3 has three layers including the polyimide film 161, the glass coating 162, and the interlayer film 164, or three layers including the polyimide film 161, the glass coating 162, and the electrode 163. FIG. 29 illustrates a case where the film formation pattern 3 has four layers including the polyimide film 161, the glass coating 162, the electrode 163, and the interlayer film 164.

Figure 30:
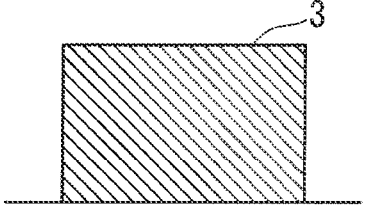
FIG. 30 is a view illustrating a film formation pattern of a single layer in which the entire upper surface is flat.
Figure 31:
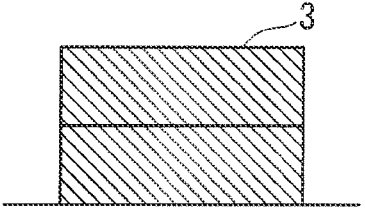
FIG. 31 is a view illustrating a film formation pattern of two layers in which the entire upper surface is flat.

FIGS. 30 to 39 illustrate the shapes of the upper surface of the film formation pattern 3. FIGS. 30 and 31 each illustrate an example in which the upper surface of the film formation pattern 3 is flat like the film constituting the chip 12. The film formation pattern 3 of FIG. 30 has a single layer, and the film formation pattern 3 of FIG. 31 has two layers.

Figure 32:
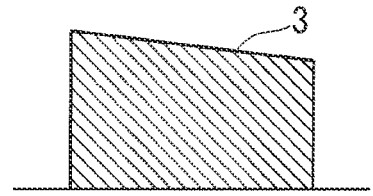
FIGS. 32 and 33 are views each illustrating a film formation pattern of a single layer in which the entire upper surface is inclined.
Figure 33:
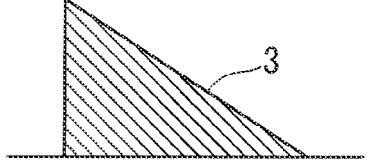
Figure 34:
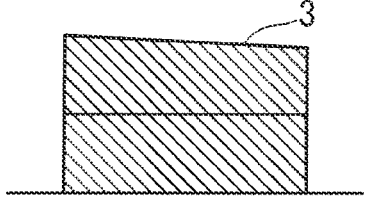
FIGS. 34 and 35 are views each illustrating a film formation pattern of two layers in which the entire upper surface is inclined.
Figure 35:
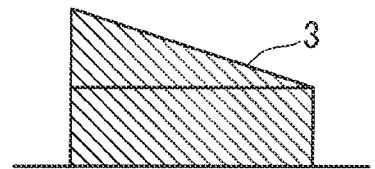
Figure 36:
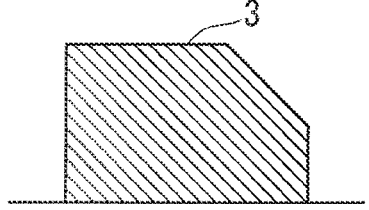
FIG. 36 is a view illustrating a film formation pattern of a single layer in which part of the upper surface is inclined.
Figure 37:
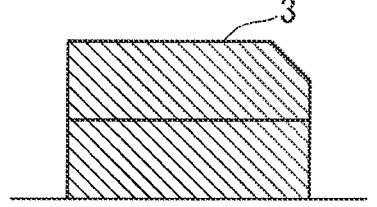
FIG. 37 is a view illustrating a film formation pattern of two layers in which part of the upper surface is inclined.
Figure 38:
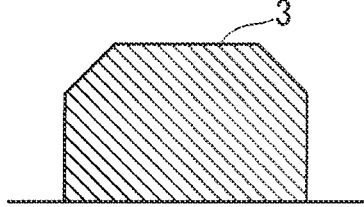
FIG. 38 is a view illustrating a film formation pattern of a single layer in which part of the upper surface is inclined.
Figure 39:
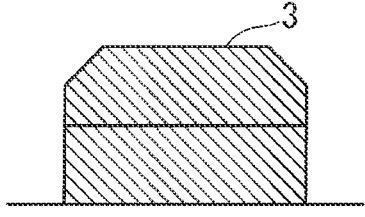
FIG. 39 is a view illustrating a film formation pattern of two layers in which part of the upper surface is inclined.

FIGS. 32 to 35 each illustrate an example in which the entire upper surface of the film formation pattern 3 is inclined. Each of the film formation patterns 3 in FIGS. 32 and 33 has a single layer, and each of the film formation patterns 3 in FIGS. 34 and 35 has two layers. FIGS. 32 and 34 each illustrate the film formation pattern 3 having a small inclination angle of the upper surface, and FIGS. 33 and 35 each illustrate the film formation pattern 3 having a large inclination angle of the upper surface.

FIGS. 36 to 39 each illustrate an example in which part of the upper surface of the film formation pattern 3 is inclined. Each of the film formation patterns 3 in FIGS. 36 and 37 has one inclined surface, and each of the film formation patterns 3 in FIGS. 35 and 39 has two inclined surfaces. Each of the film formation patterns 3 in FIGS. 36 and 38 has a single layer, and each of the film formation patterns 3 in FIGS. 37 and 39 has two layers.

FIGS. 40 to 43 are cross-sectional views of the semiconductor wafer 101 each illustrating a relationship between the film formation pattern 3 and a chip terminal portion 121 as a cross-sectional form of the film formation pattern 3. The following four patterns are assumed as the relationship between the film formation pattern 3 and the chip terminal portion 121.

Figure 40:
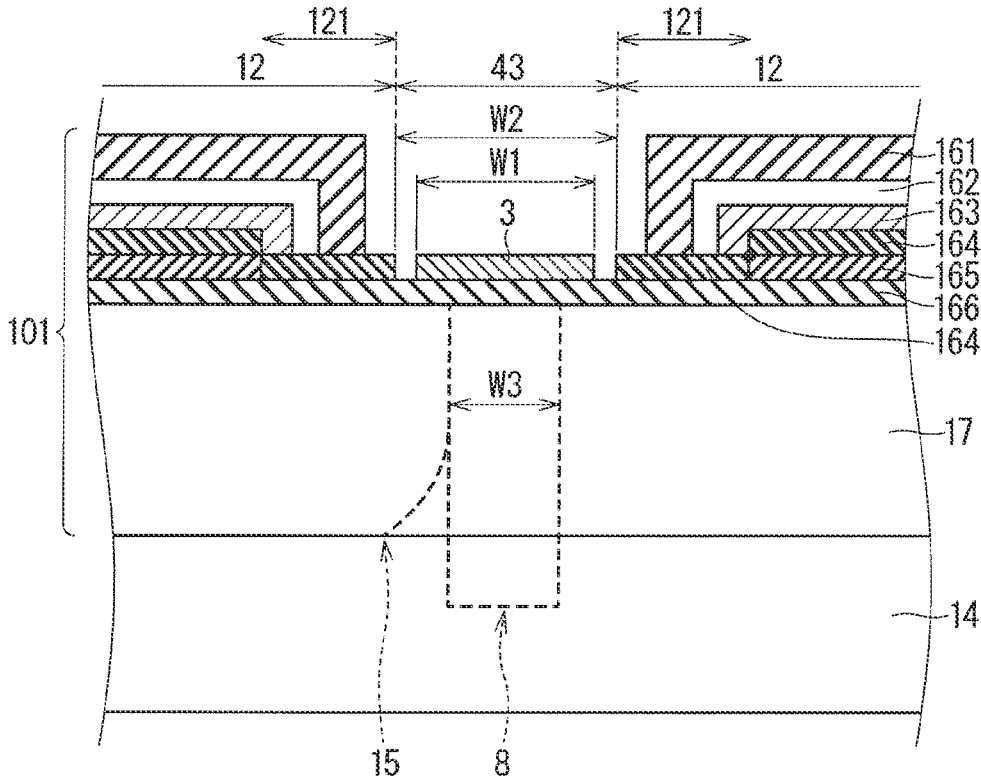
FIG. 40 is a cross-sectional view of a semiconductor wafer illustrating the film formation pattern provided apart from a chip terminal portion.

(1) As illustrated in FIG. 40, the film formation pattern 3 is arranged at an appropriate interval so as not to contact the film forming the chip terminal portion 121 adjacent to the on-pattern 43. This planar form is referred to as an "island shape" in FIG. 47. The width W1 of the film formation pattern 3 is smaller than the width W2 of the on-pattern DL 43, and the film formation pattern 3 is not in contact with the chip 12 adjacent to the on-pattern DL 43.

Figure 41:
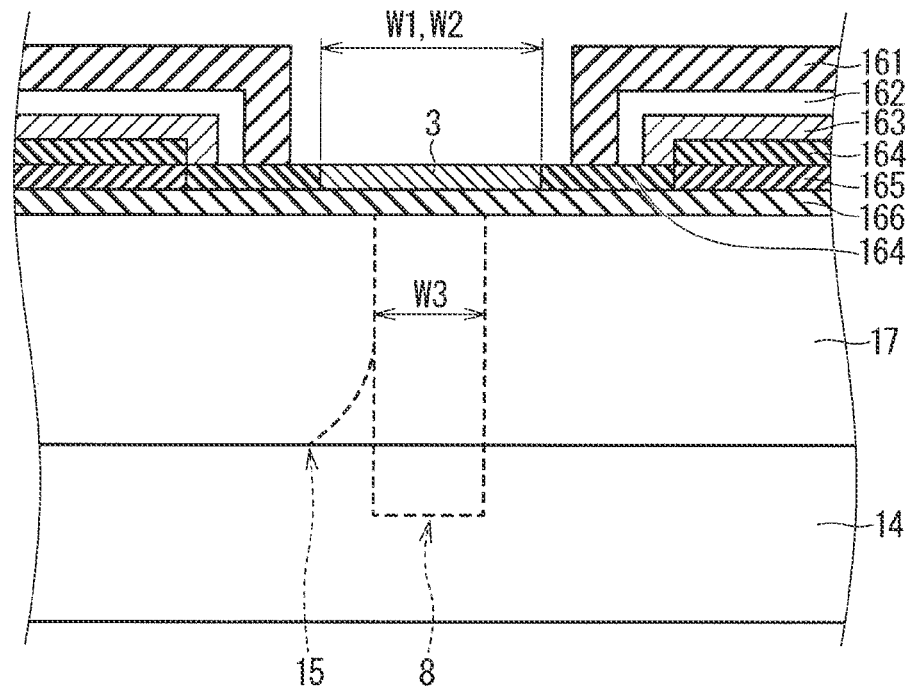
FIG. 41 is a cross-sectional view of a semiconductor wafer in which the entire DL is covered with the film formation pattern.

(2) As illustrated in FIG. 41, the film formation pattern 3 covers the entire on-pattern DL 43 and is in contact with the side surface of the interlayer film 164 constituting the chip terminal portion 121, that is, the side surface of the chip 12. That is, the width W1 of the film formation pattern 3 is equal to the width W2 of the on-pattern DL 43. This planar form is referred to as "DL fully covered" in FIG. 47.

Figure 42:
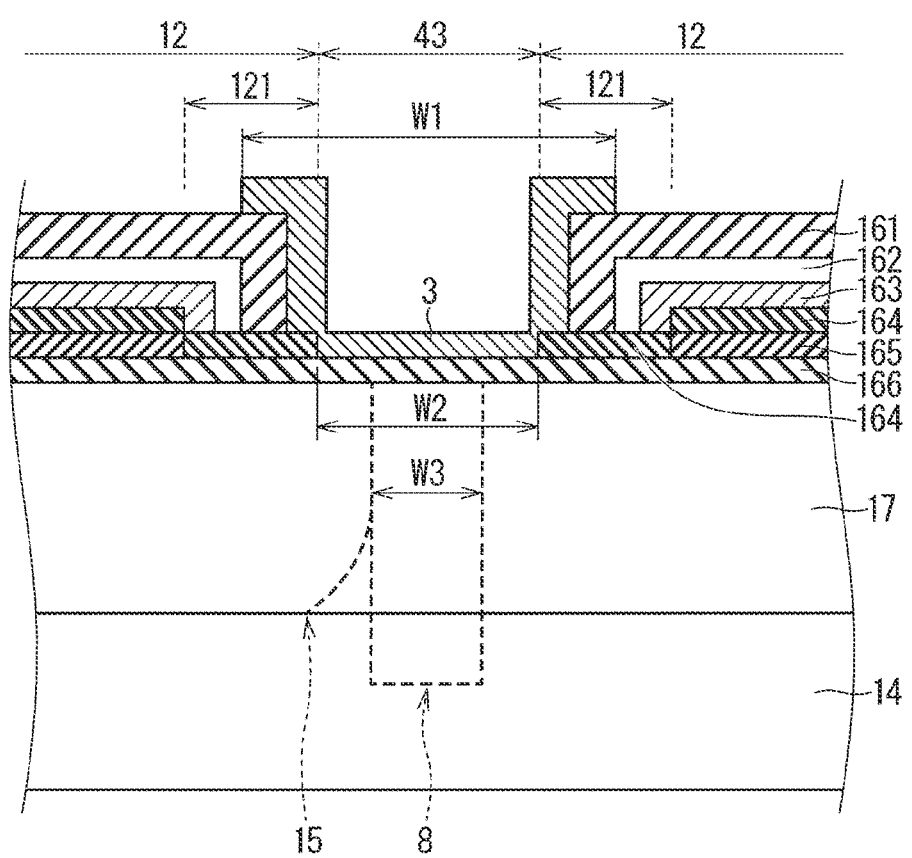
FIG. 42 is a cross-sectional view of a semiconductor wafer in which part of the chip terminal portion is covered with the film formation pattern.

(3) As illustrated in FIG. 42, the film formation pattern 3 covers the entire on-pattern DL 43 and covers the side surface and part of the upper surface of each of the interlayer film 164 and the polyimide film 161 constituting the chip terminal portion 121. That is, the width W1 of the film formation pattern 3 is greater than the width W2 of the on-pattern DL 43. This planar form is referred to as "chip terminal portion covered" in FIG. 47.

Figure 43:
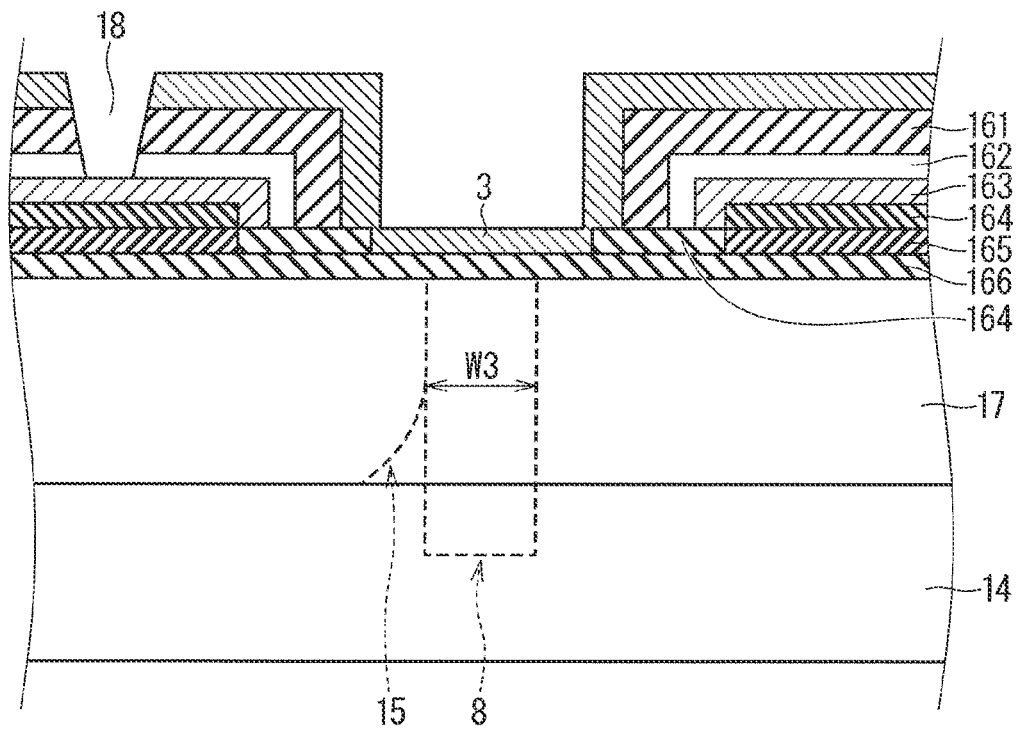
FIG. 43 is a cross-sectional view of a semiconductor wafer in which the entire surface of the chip is covered with the film formation pattern.

(4) As illustrated in FIG. 43, the film formation pattern 3 covers the entire on-pattern DL 43 and covers the entire surface of the chip 12 adjacent to the on-pattern DL 43 except for an opening 18. That is, the width W1 of the film formation pattern 3 is greater than the width W2 of the on-pattern DL 43. In the opening 18, the film formation pattern 3, the polyimide film 161, and the glass coating 162 are locally removed, and the electrode 163 is exposed. The opening 18 is provided to electrically connect the electrode 163 to the outside of the chip 12 by wire bonding or the like. This planar form is referred to as "entire chip covered" in FIG. 47.

In any of the above patterns, in order to reduce chipping or cracks in the semiconductor wafer 101 in dicing, the width W1 of the film formation pattern 3 is desirably greater than the width W3 of the dicing blade 8.

Specifically, the ratio W1/W3 of the width W1 of the film formation pattern 3 to the width W3 of the dicing blade 8 is preferably greater than 1.0 and less than 2.4 in the patterns (1) and (2), and is preferably 2.4 or more in the patterns (3) and (4).

By defining the relationship between the width W1 of the film formation pattern 3 and the width W3 of the dicing blade 8 as described above the remains of the film formation pattern 3 continues to exist in part of the DL on the chip after dicing. Therefore, it is easier to find out that the present configuration is adopted from the appearance or the like at the initial stage of product analysis.

In the pattern (1) in which the film formation pattern 3 is arranged in the island shape in the on-pattern DL 43, since the film formation pattern 3 is not in contact with the chip terminal portion 121, the film formation pattern 3 may be a conductive film. In the other patterns (2), (3), and (4), since the film formation pattern 3 is in contact with the chip terminal portion 121, the film formation pattern 3 needs to be a non-conductive film.

In the patterns (3) and (4), the film formation pattern 3 may be formed using an existing protective film instead of additionally forming a film on the on-pattern DL 43 in the wafer front-end process. That is, the film formation pattern 3 may be formed by extending an existing protective film such as the polyimide film 161 or the glass coating 162 which conventionally only extends to the chip terminal portion 121, into the on-pattern DL 43.

The following patterns are assumed as planar forms of the film formation pattern 3.

Figure 44:
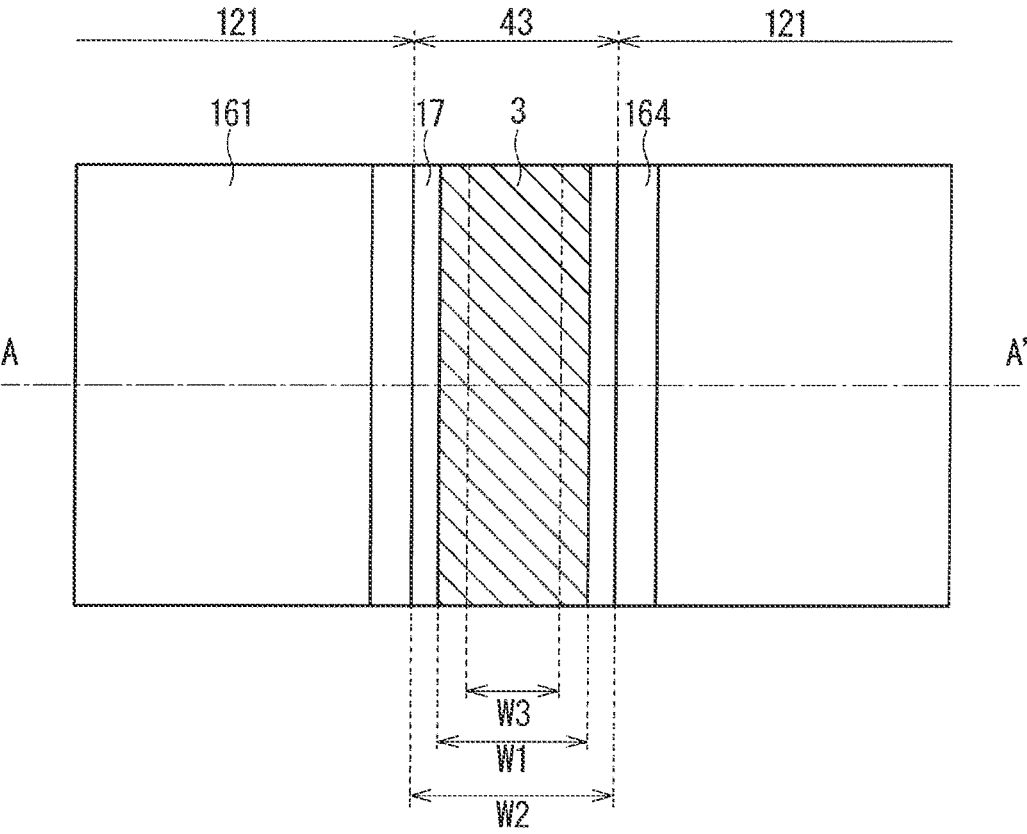
FIG. 44 is a plan view illustrating the film formation pattern continuously formed in the longitudinal direction of the DL.

(1) As illustrated in FIG. 44, the film formation pattern 3 covers entirety of the on-pattern DL 43 in the longitudinal direction. This planar form is referred to as "entire surface covered" in FIG. 47. According to "entire surface covered", the area of the film formation pattern 3 is increased, and the effect of reducing chipping is enhanced.

Figure 45:
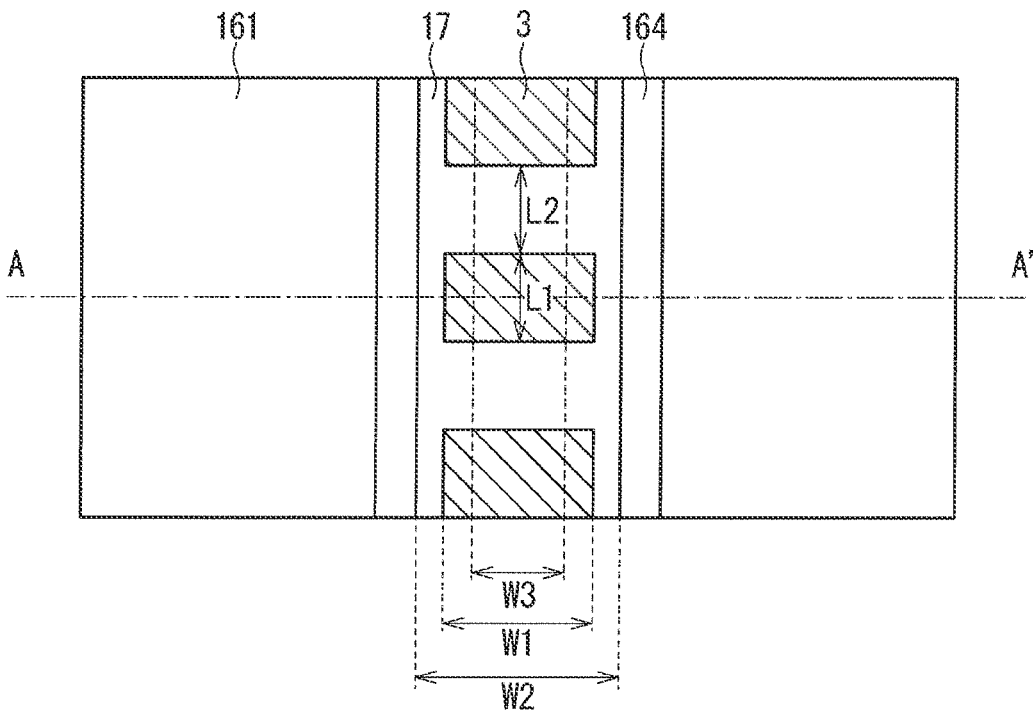
FIG. 45 is a plan view illustrating the film formation patterns arranged so as to be divided at equal intervals in the longitudinal direction of the DL.

(2) As illustrated in FIG. 45, the film formation patterns 3 are intermittently arranged in the longitudinal direction of the on-pattern DL 43. An interval L2 between two film formation patterns 3 adjacent to each other in the longitudinal direction of the on-pattern DL 43 is equal to a length L1 of the film formation pattern 3. The number of film formation patterns 3 arranged in the longitudinal direction of one on-pattern DL 43 is two or three. This planar form is referred to as "divided at equal intervals" in FIG. 47.

Figures 46, 47:
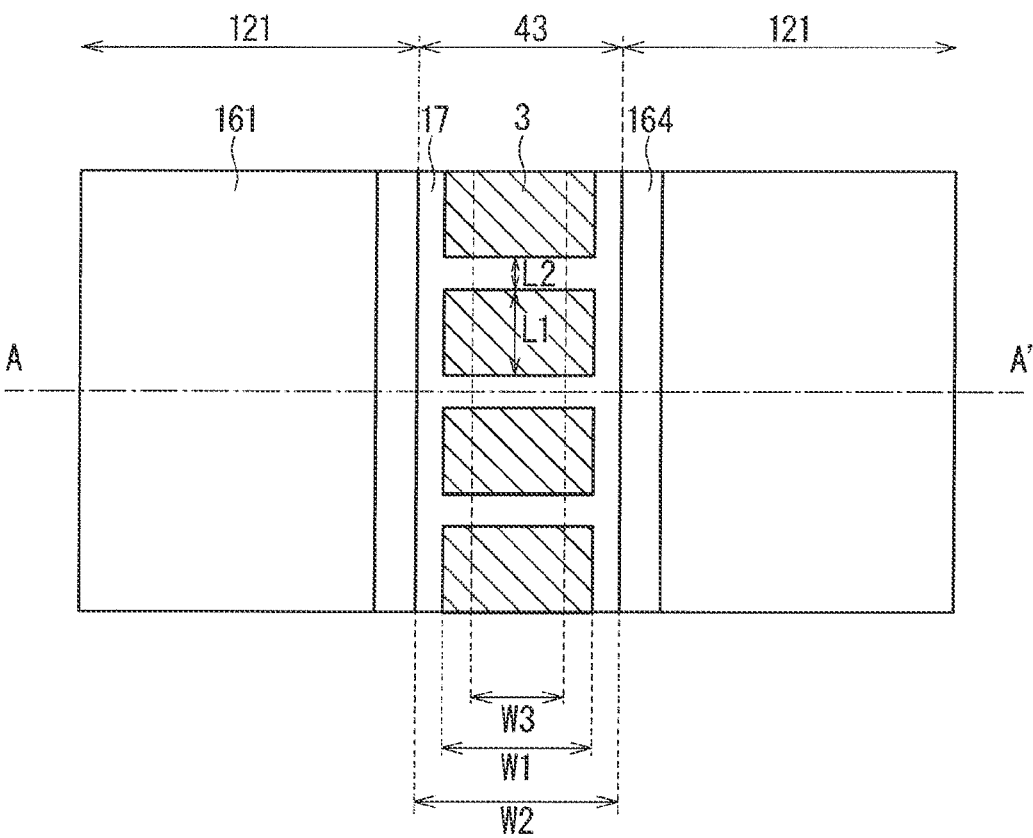
FIG. 46 is a plan view illustrating film formation patterns arranged so as to be finely divided in the longitudinal direction of the DL.
FIG. 47 is a diagram illustrating combinations of a cross-sectional form and a planar form of the film formation pattern.

(3) As illustrated in FIG. 46, the film formation patterns 3 are intermittently arranged in the longitudinal direction of the on-pattern DL 43. The number of film formation patterns 3 arranged in the longitudinal direction of one on-pattern DL 43 is four or more. The interval L2 between two film formation patterns 3 adjacent to each other in the longitudinal direction of the on-pattern DL 43 is arbitrary. This planar form is referred to as "finely divided" in FIG. 47.

FIG. 47 is a diagram illustrating possible combinations of the cross-sectional form and the planar form of the film formation pattern 3. In a case where the planar form of the film formation pattern 3 is "entire surface covered", the possible cross-sectional form of the film formation pattern 3 is any one of "island shape", "DL fully covered", "chip terminal portion covered", and "entire chip covered". In a case where the planar form of the film formation pattern 3 is "divided at equal intervals" or "finely divided", the possible cross-sectional form of the film formation pattern 3 is "island shape" or "DL fully covered".

Figure 48:
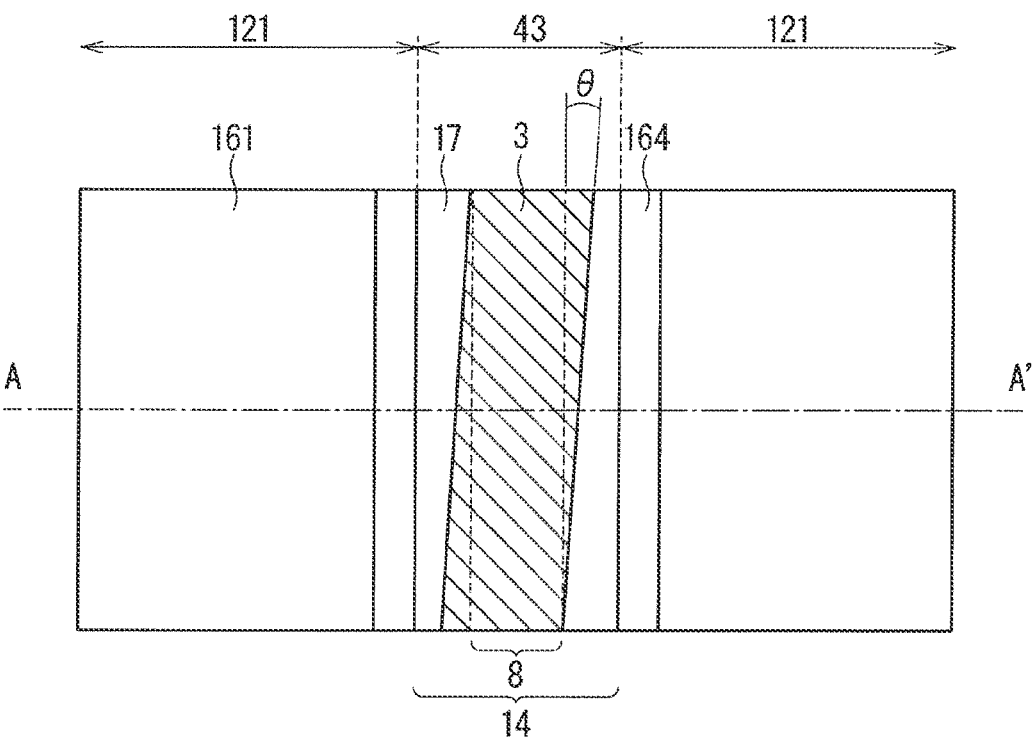
FIG. 48 is a plan view illustrating the film formation pattern arranged obliquely with respect to the chip pattern.

As illustrated in FIG. 48, the longitudinal direction of the film formation pattern 3 may have an angle θ with respect to the longitudinal direction of the on-pattern DL 43. However, the angle θ is determined within a range in which the film formation pattern 3 does not deviate from the on-pattern DL 43.

FIG. 48 illustrates the film formation pattern 3 having a planar form "entire surface covered", however, the same applies to the film formation pattern 3 having a planar form "divided at equal intervals" or "finely divided". That is, in the case of the film formation pattern 3 having a planar form "divided at equal intervals" or "finely divided", the arrangement direction of the film formation pattern 3 on the on-pattern DL 43 is set to have the angle θ with respect to the longitudinal direction of the on-pattern DL 43.

<C-2. Effect>

In the semiconductor wafer 101 according to the third preferred embodiment, the chip 12 includes the semiconductor substrate 17, and the interlayer film 164, the electrode 163, and a surface protective film that are formed on the semiconductor substrate 17, and the film formation pattern 3 is made of the same material as that of at least one of the interlayer film 164, the electrode 163, and the surface protective film. As described above, according to the semiconductor wafer 101, the film formation pattern 3 can be made of a film constituting the chip 12. Therefore, it is not necessary to add a special photolithography process for forming the film formation pattern 3 in the on-pattern DL 43, and an increase in man-hours can be avoided. In addition, by selecting one film from the plurality of films constituting the chip 12 or combining a plurality of films constituting the chip 12 and adopting the combined films as the film formation pattern 3, an appropriate chipping reduction effect can be obtained according to the degree of warpage or distortion of the semiconductor wafer 101.

D. Fourth Preferred Embodiment

In a fourth preferred embodiment, functions of the film formation pattern 3 of the semiconductor wafer 101 will be described.

<D-1. TEG>

Figure 49:
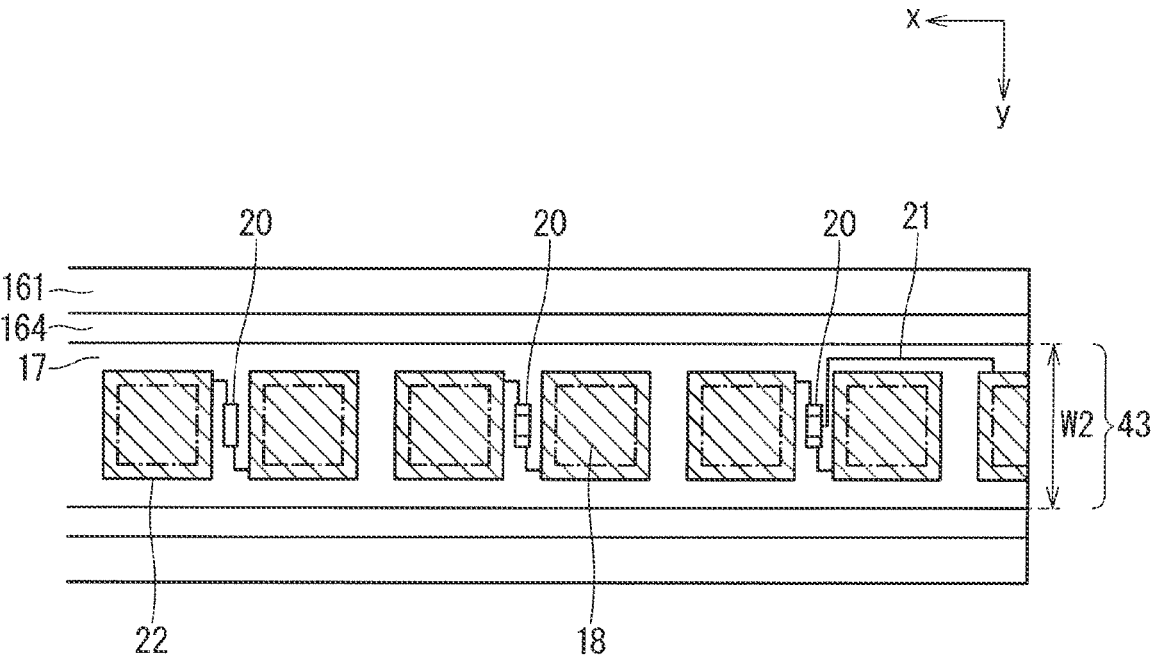
FIG. 49 is a plan view illustrating a film formation pattern constituting a TEG.
Figure 50:
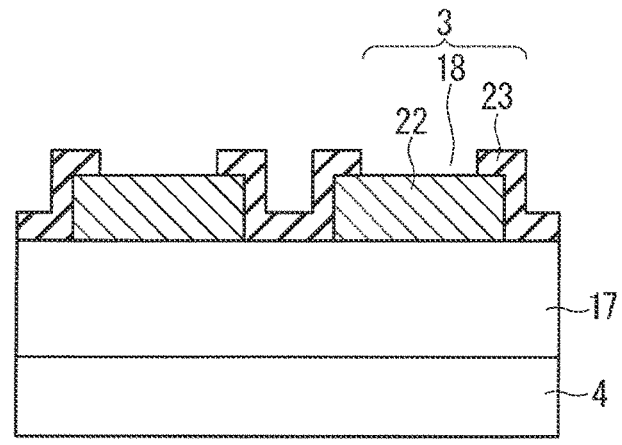
FIG. 50 is a cross-sectional view illustrating the film formation pattern constituting the TEG.

FIG. 49 is a plan view illustrating a film formation pattern 3 having a function of a test element group (TEG). FIG. 50 is a cross-sectional view of the film formation pattern 3 corresponding to FIG. 49. The film formation pattern 3 having the function of the TEG includes a measurement target element 20, a wiring 21, a pad 22, and a protective film 23. The wiring 21 is a routing wiring obtained by forming a conductive layer of Al, AlSi, poly-Si, or the like. The pad 22 is a place where a probe needle for measuring an electrical characteristic hits. The protective film is made of polyimide, a glass coating, or the like.

The plurality of pads 22 is arranged on the semiconductor substrate 17 at regular intervals on the on-pattern DL 43. The measurement target element 20 is disposed between the adjacent pads 22. The wiring 21 connects the pad 22 and the measurement target element 20. Although not illustrated, in FIG. 49, the protective film 23 covers entirety of the pad 22, the wiring 21, and the measurement target element 20 except for the opening 18 of the pad 22 as illustrated in FIG. 50.

Figure 51:
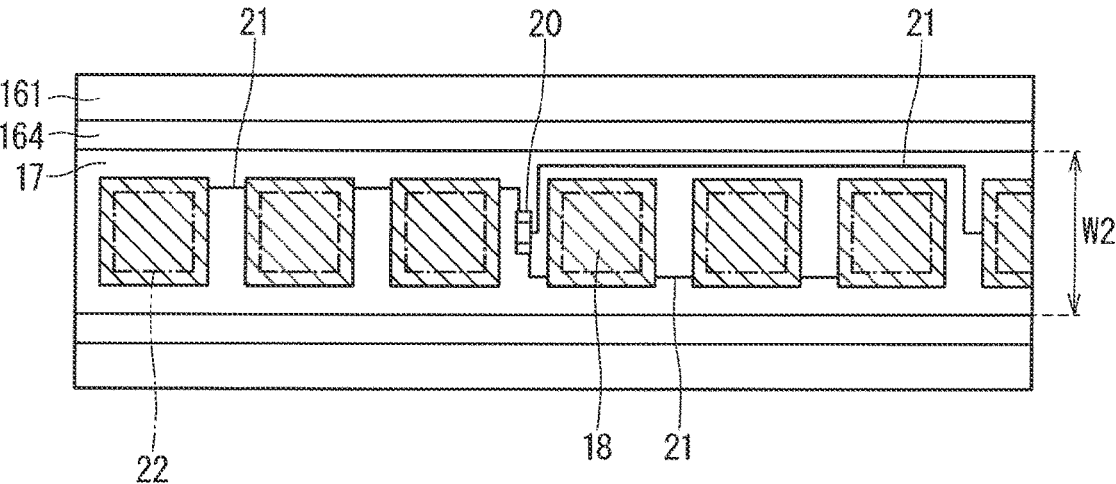
FIGS. 51 to 54 are plan views each illustrating a film formation pattern constituting a TEG.

As illustrated in FIG. 51, a plurality of pads 22 may be connected by the wiring 21 to form one electrode.

Figure 52:
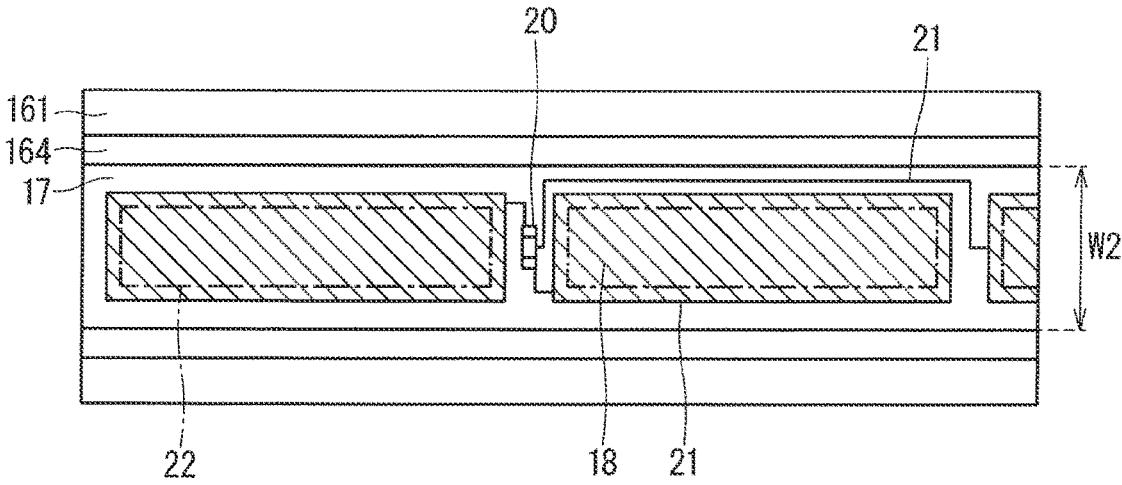

The size of the pad 22 is arbitrary. FIG. 52 illustrates an example in which the pad 22 is made longer than that in FIG. 49. The shape, size, and number of the openings 18 of the pad 22 are arbitrary.

Figure 53:
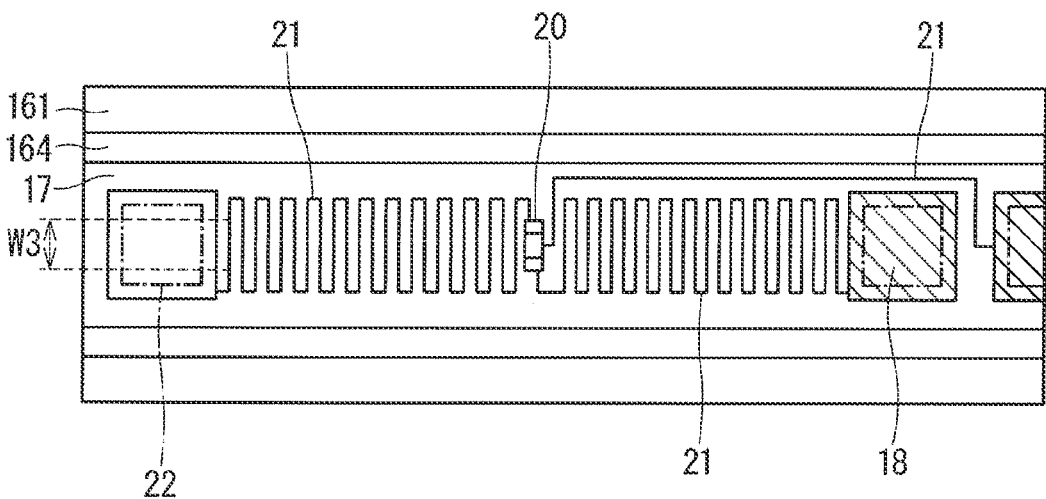
Figure 54:
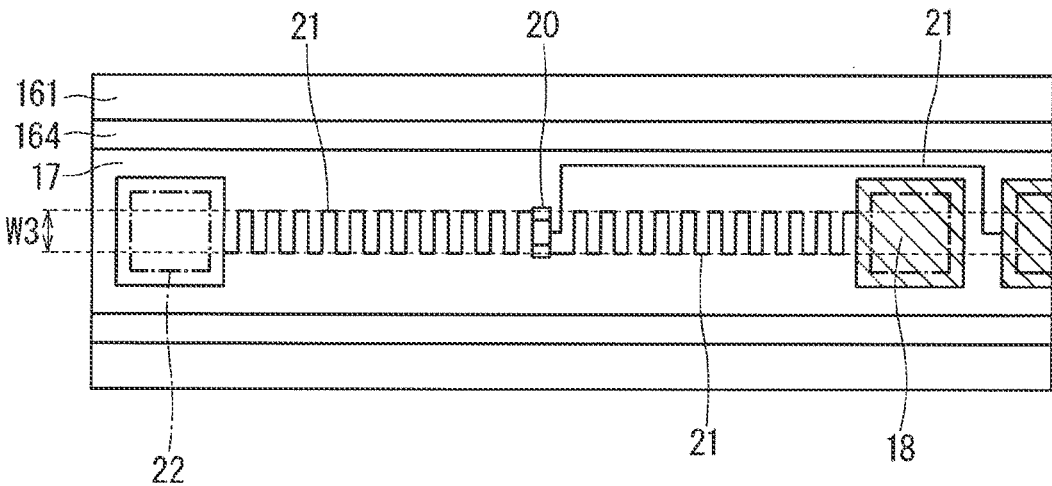

As illustrated in FIGS. 53 and 54, the wiring 21 connecting the pad 22 and the measurement target element 20 may be extended and folded a plurality of times with the same width as that of the pad 22. The folded width of the wiring 21 may be greater than the width W3 of the dicing blade as illustrated in FIG. 53, or may be the same as the width W3 of the dicing blade as illustrated in FIG. 54.

<D-2. Mark or the Like>

Hereinafter, film formation patterns each having a function as a mark or the like will be described.

Figure 55:
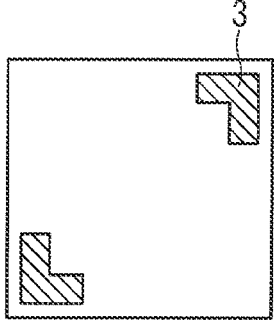
FIGS. 55 to 57 are plan views each illustrating a film formation pattern constituting an alignment mark.
Figure 56:
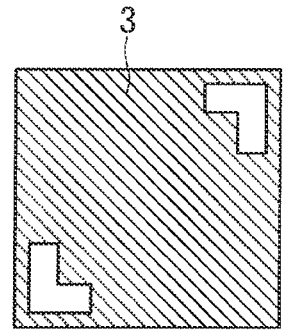
Figure 57:
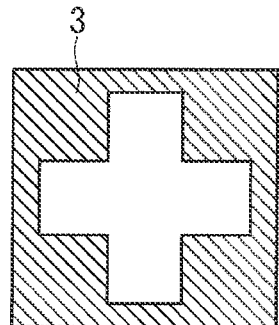

FIGS. 55 to 57 each illustrate a film formation pattern 3 functioning as an alignment mark.

Figure 58:
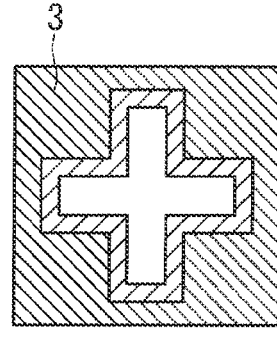
FIG. 58 is a plan view illustrating a film formation pattern constituting a target.

FIG. 58 illustrates a film formation pattern 3 functioning as a target.

Figure 59:
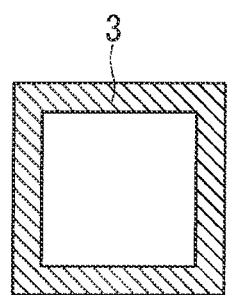
FIG. 59 is a plan view illustrating a film formation pattern constituting a reference marking.

FIG. 59 illustrates a film formation pattern 3 functioning as a reference in king.

The film formation pattern 3 illustrated in each of FIGS. 55 to 59 is a film formation pattern for improving overlay accuracy of a film and a photomask formed in the previous stage and mainly used in the photolithography process of the wafer front-end process.

<D-3. Monitor Pattern>

Hereinafter, film formation patterns each having a function as a monitor pattern will be described.

Figure 60:
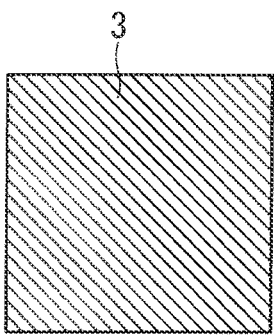
FIGS. 60 to 71 are plan views each illustrating a film formation pattern constituting a monitor pattern.

FIG. 60 illustrates a film formation pattern 3 as a monitor pattern for measuring film thickness, concentration, reflectance, refractive index, or the like.

Figure 61:
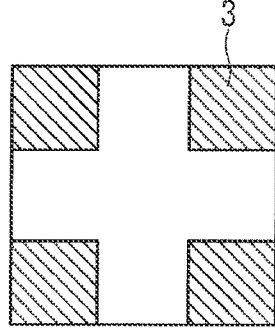
Figure 62:
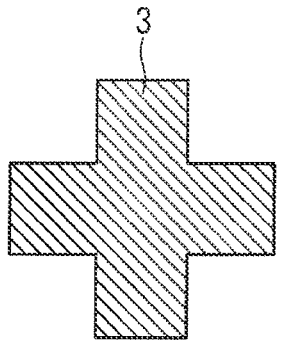

FIGS. 61 and 62 illustrate film formation patterns 3 as monitor patterns for an overlay inspection.

Figure 63:
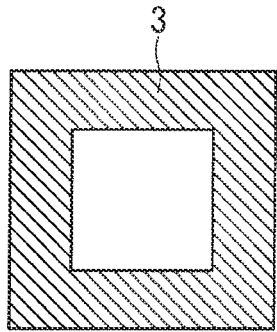
Figure 64:
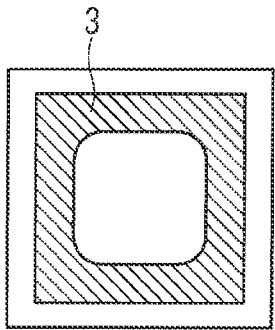
Figure 65:
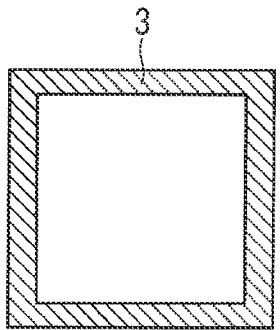

FIGS. 63 to 65 each illustrate a film formation pattern 3 as a monitor pattern for a shape such as a contact hole.

Figure 66:
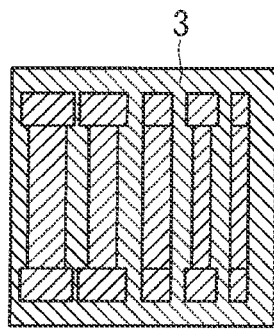
Figure 67:
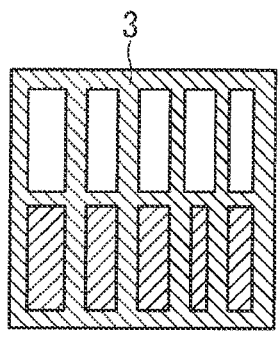

FIGS. 66 and 67 each illustrate a film formation pattern 3 as a monitor pattern for measuring dimensions of a photolithography pattern.

Figure 68:
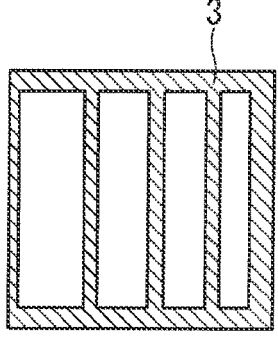
Figure 69:
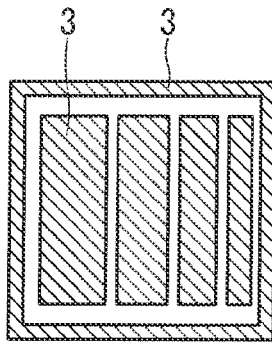

FIGS. 68 and 69 each illustrate a film formation pattern 3 as a monitor pattern for measuring the length of a cut-out or a remaining portion of a photolithography pattern.

Figure 70:
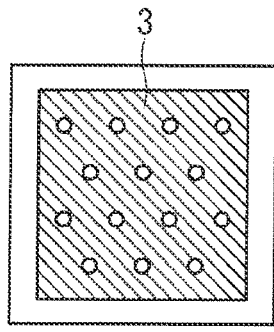

FIG. 70 illustrates a film formation pattern 3 as a monitor pattern for a grain size in a metal film made of aluminum or the like.

Figure 71:
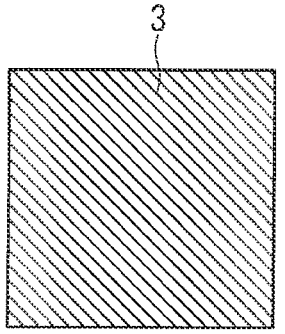

FIG. 71 illustrates a film formation pattern 3 as a monitor pattern for observing finish such as color tone or gloss.

The film formation patterns 3 as the monitor patterns described above are film formation patterns for the purpose of various measurements, inspections, and finish observation when a product chip is formed by repeating film formation, impurity diffusion, the photolithography process, and the like mainly in the wafer front-end process.

<D-4. Name or the Like>

Hereinafter, film formation patterns in which a name or the like is drawn will be described.

Figure 72:
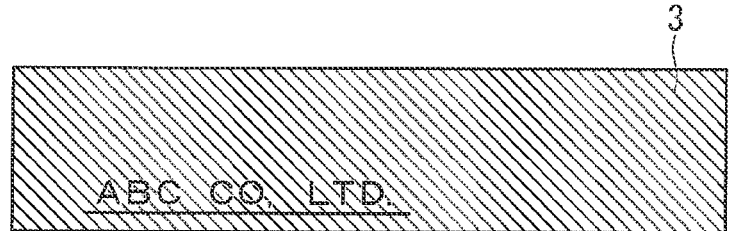
FIG. 72 is a plan view illustrating a film formation pattern in which a name is drawn.

FIG. 72 illustrates a film formation pattern 3 in which a name such as a company name or a manufacturer name is drawn.

Figure 73:
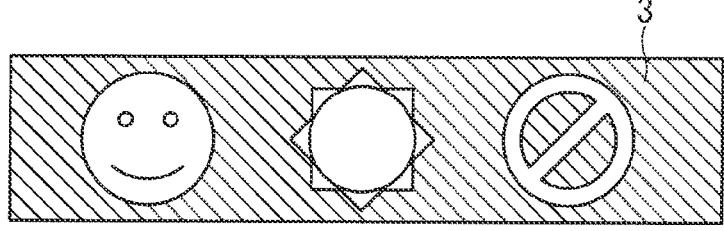
FIGS. 73 to 75 are plan views each illustrating a film formation pattern in which a design or a logo is drawn.
Figure 74:
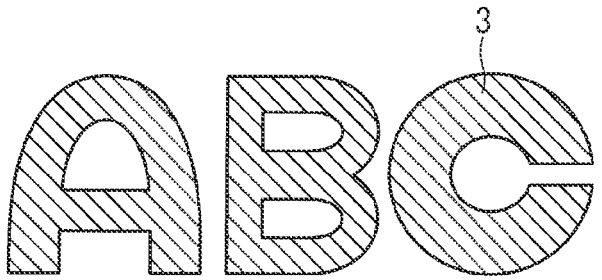
Figure 75:
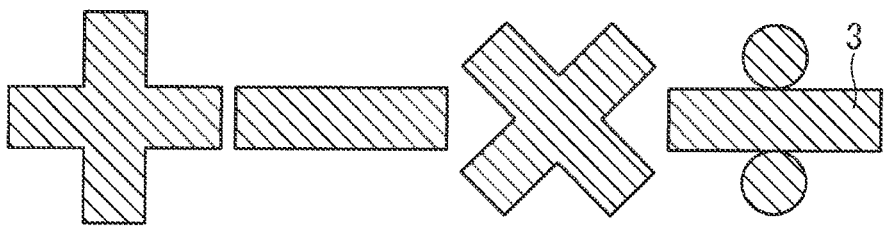

FIGS. 73 to 75 each illustrate a film formation pattern 3 in which a design or a logo is drawn.

Figure 76:
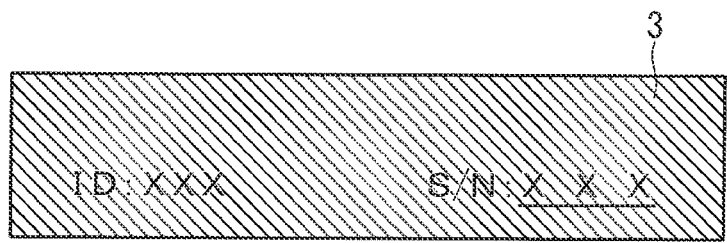
FIG. 76 is a plan view illustrating a film formation pattern on which a management number is drawn.

FIG. 76 illustrates a film formation pattern 3 in which a management number such as an ID, a S/N, or other alphanumeric characters is drawn.

In addition, the film formation pattern 3 may be one on which a registered trademark is drawn.

In the present preferred embodiment, the film formation patterns 3 which have various functions or in which names and the like are drawn have been described. However, the film formation pattern 3 may not have these functions, and a name may not be drawn in the film formation pattern 3.

In addition, in the third preferred embodiment, it has been described that a film of a type that can be manufactured by processing of the wafer frontend process and constitutes the chip 12 is adopted as the film formation pattern 3. However, the film formation pattern 3 is not indispensable for the configuration of the chip 12, and may be newly added.

<D-5. Effect>

According to the semiconductor wafer 101 of the fourth preferred embodiment, the film formation pattern 3 can be used not only for the purpose of reducing chipping but also for other functions such as TEG.

Note that the preferred embodiments can be freely combined, and the preferred embodiments can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor wafer having a plurality of dicing lines in a first direction and a second direction different from the first direction and define at least one chip in an effective area which includes a center area of the semiconductor wafer, the semiconductor wafer comprising a film formation pattern, and at least one dicing line included in the plurality of dicing lines being an on-pattern dicing line which overlaps the film formation pattern in an entire or a partial length of the on-pattern dicing line, wherein an on-pattern dicing line portion that is a portion of the on-pattern dicing line overlapping the film formation pattern includes a first portion, a length of the first portion being equal to ½ of an entire length of the on-pattern dicing line, the first portion being entirely in an ineffective area, the ineffective area being an area other than the effective area of the semiconductor wafer and extending along a portion of an outer perimeter of the semiconductor wafer without including the center area of the semiconductor wafer.

2. The semiconductor wafer according to claim 1, wherein the on-pattern dicing line is first five or less dicing lines that were made in order of cutting in a dicing process among the plurality of dicing lines in the first direction.

3. The semiconductor wafer according to claim 1, wherein the on-pattern dicing line is first three or more and five or less dicing lines that were made in order of cutting in a dicing process among the plurality of dicing lines in the first direction, and first three or more and five or less dicing lines that were made in order of cutting in the dicing process among the plurality of dicing lines in the second direction.

4. The semiconductor wafer according to claim 1, wherein an on-pattern dicing line portion that is the portion of the on-pattern dicing line overlapping the film formation pattern exists only in the ineffective area.

5. The semiconductor wafer according to claim 1, wherein the chip includes a semiconductor substrate, and an interlayer film, an electrode, and a surface protective film formed on the semiconductor substrate, and the film formation pattern is made of a material same as a material of at least one of the interlayer film, the electrode, and the surface protective film.

6. The semiconductor wafer according to claim 5, wherein a width of the film formation pattern is greater than a width of the on-pattern dicing line, and the film formation pattern covers an upper surface of the chip except for an opening provided in the chip for electrically connecting the electrode to an outside of the chip.

7. The semiconductor wafer according to claim 1, wherein a width of the film formation pattern is smaller than a width of the on-pattern dicing line, and the film formation pattern is not in contact with the chip adjacent to the on-pattern dicing line.

8. The semiconductor wafer according to claim 1, wherein a width of the film formation pattern is equal to a width of the on-pattern dicing line, and the film formation pattern is in contact with a side surface of the chip adjacent to the on-pattern dicing line.

9. The semiconductor wafer according to claim 1, wherein a width of the film formation pattern is greater than a width of the on-pattern dicing line, and the film formation pattern covers a terminal portion of the chip adjacent to the on-pattern dicing line.

10. The semiconductor wafer according to claim 1, wherein the width of the film formation pattern is greater than a width of a dicing blade that dices the semiconductor wafer.

11. The semiconductor wafer according to claim 1, wherein the film formation pattern covers entirety of the on-pattern dicing line in a longitudinal direction.

12. The semiconductor wafer according to claim 1, wherein a plurality of the film formation patterns is intermittently arranged in a longitudinal direction of the on-pattern dicing line.

13. The semiconductor wafer according to claim 1, wherein a longitudinal direction or an arrangement direction of the film formation pattern has an angle with respect to the longitudinal direction of the on-pattern dicing line within a range in which the film formation pattern does not deviate from the on-pattern dicing line.

14. The semiconductor wafer according to claim 1, wherein the film formation pattern has a function as an alignment mark, a target, or a reference marking.

15. The semiconductor wafer according to claim 1, wherein the film formation pattern has a function as a monitor pattern.

16. The semiconductor wafer according to claim 1, wherein the film formation pattern is a pattern in which a name, a logo, or a management number is drawn.

17. The semiconductor wafer according to claim 1, wherein a semiconductor material of the semiconductor wafer is Si, SiC, or GaN.

* * * * *